United States Patent

Grabowski et al.

[11] Patent Number: 6,140,678
[45] Date of Patent: *Oct. 31, 2000

[54] TRENCH-GATED POWER MOSFET WITH PROTECTIVE DIODE

[75] Inventors: Wayne B. Grabowski, Los Altos; Richard K. Williams, Cupertino; Mohamed N. Darwish, Saratoga, all of Calif.

[73] Assignee: Siliconix Incorporated, Santa Clara, Calif.

[*] Notice: This patent is subject to a terminal disclaimer.

[21] Appl. No.: 08/962,867

[22] Filed: Nov. 3, 1997

Related U.S. Application Data

[63] Continuation-in-part of application No. 08/846,688, Apr. 30, 1997, Pat. No. 5,998,836, which is a continuation of application No. 08/459,555, Jun. 2, 1995, abandoned.

[51] Int. Cl.[7] .......................... H01L 29/78; H01L 29/745
[52] U.S. Cl. ........................... 257/328; 257/341; 257/339
[58] Field of Search .................... 257/341, 328, 257/339

[56] References Cited

U.S. PATENT DOCUMENTS

| | | | |
|---|---|---|---|
| 3,906,540 | 9/1975 | Hollins | 357/15 |
| 4,823,172 | 4/1989 | Mihara | 357/15 |
| 4,827,321 | 5/1989 | Baliga | 357/37 |
| 4,928,155 | 5/1990 | Nakagawa et al. | 357/23.4 |
| 4,967,243 | 10/1990 | Baliga et al. | 357/23.4 |
| 5,021,840 | 6/1991 | Morris | 357/15 |
| 5,072,266 | 12/1991 | Bulucea et al. | 357/23.4 |
| 5,111,253 | 5/1992 | Korman et al. | 357/15 |
| 5,168,331 | 12/1992 | Yilmaz | 257/331 |
| 5,191,395 | 3/1993 | Nishimura | 257/328 |
| 5,396,085 | 3/1995 | Baliga | 257/77 |
| 5,614,749 | 3/1997 | Ueno | 257/330 |
| 5,621,234 | 4/1997 | Kato | 257/339 |
| 5,689,128 | 11/1997 | Hshieh et al. | 257/331 |
| 5,696,396 | 12/1997 | Tokura et al. | 257/341 |
| 5,814,858 | 9/1998 | Williams | 257/328 |

FOREIGN PATENT DOCUMENTS

| | | | |
|---|---|---|---|
| 0 133 642 A1 | 3/1985 | European Pat. Off. | H01L 27/06 |
| 0 438 700 A1 | 7/1991 | European Pat. Off. | H01L 29/74 |
| 0 583 022 A3 | 2/1994 | European Pat. Off. | H01L 21/336 |
| 0 583 028 A1 | 2/1994 | European Pat. Off. | H01L 29/784 |
| 0 746 029 | 12/1996 | European Pat. Off. | H01L 27/02 |
| 0 746 030 | 12/1996 | European Pat. Off. | H01L 27/02 |
| 42 08 695 A1 | 9/1992 | Germany | H01L 29/784 |
| 62-298152 | 12/1987 | Japan | H01L 27/08 |
| 8-148699 | 6/1996 | Japan | H01L 29/861 |
| 2 269 050 | 1/1994 | United Kingdom | H01L 29/06 |

OTHER PUBLICATIONS

Masakatsu Hoshi, et al., "A DMOSFET Having A Cell Array Field Ring for Improving Avalanche Capability", May 18, 1993, Proceedings of the International Symposium on Power Semiconductor Devices and IC's (ISPSD), Monterey, May 18–20, 1993, pp. 141–145, XP000380145.

*Primary Examiner*—Jerome Jackson, Jr.
*Attorney, Agent, or Firm*—Skjerven, Morrill, MacPherson, Franklin & Friel LLP; David E. Steuber

[57] ABSTRACT

A power MOSFET includes a trenched gate which defines a plurality of MOSFET cells. A protective diffusion is created, preferably in an inactive cell, so as to form a diode that is connected in parallel with the channel region in each of the MOSFET cells. The protective diffusion, which replaces the deep central diffusion taught in U.S. Pat. No. 5,072,266, prevents impact ionization and the resulting generation of carriers near the corners of the gate trench, which can damage or rupture the gate oxide layer. Moreover, the diode can be designed to have a breakdown voltage which limits the strength of the electric field across the gate oxide layer. The elimination of a deep central diffusion permits an increase in cell density and improves the on-resistance of the MOSFET. Specifications for a number of commercially acceptable devices are given.

14 Claims, 33 Drawing Sheets

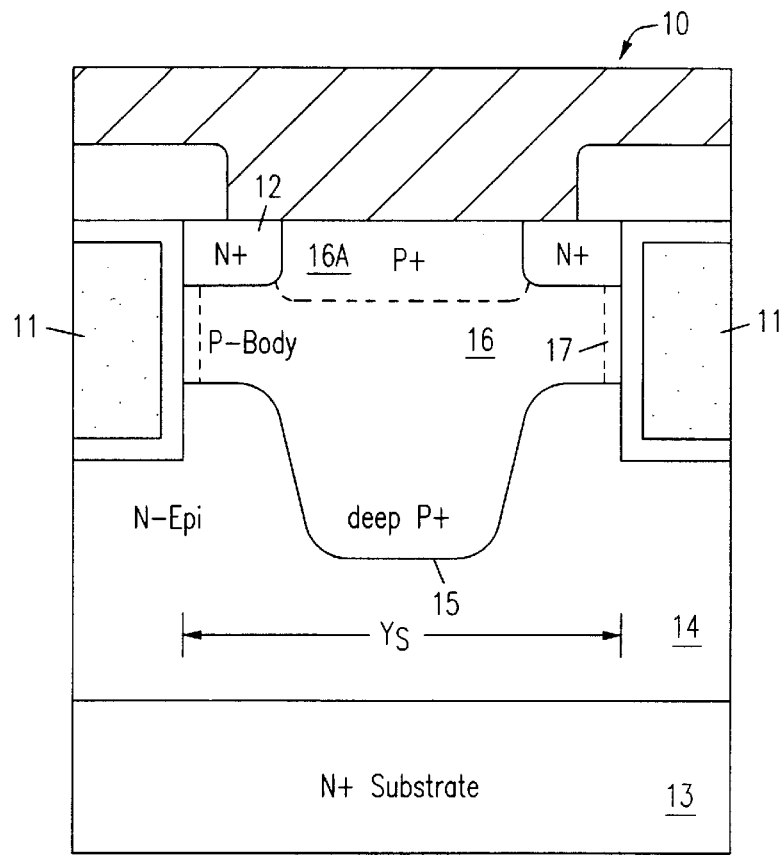
(PRIOR ART)
FIG. 1
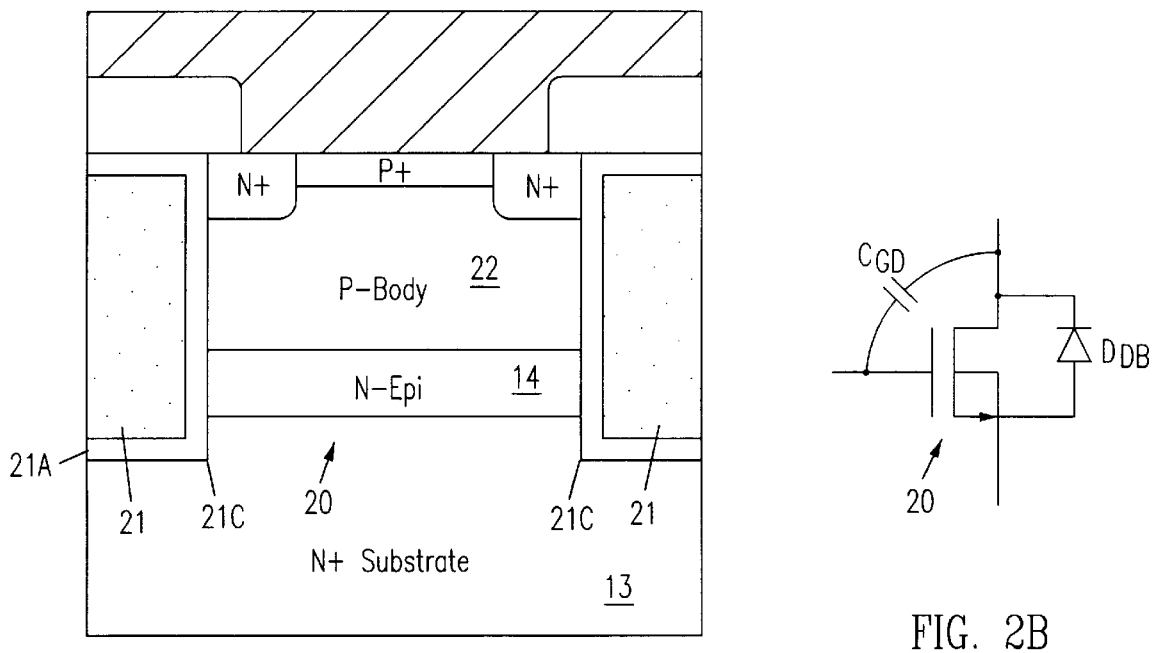
FIG. 2A
FIG. 2B

TRENCH-GATED POWER MOSFET WITH PROTECTIVE DIODE

This application is a continuation-in-part of application Ser. No. 08/846,688, filed Apr. 30, 1997, now U.S. Pat. No. 5,998,836 which is a continuation application Ser. No. 08/459,555, filed Jun. 2, 1995, now abandoned. The subject matter of this application is related to the subject matter of application Ser. No. 08/884,826, filed Jun. 30, 1997, and application Ser. No. 08/429,414, filed Apr. 26, 1995, now U.S. Pat. No. 5,674,766, issued Oct. 7, 1997. Each of the foregoing applications is incorporated herein by reference in its entirety.

FIELD OF THE INVENTION

This invention relates to power field-effect transistors and, in particular, to a metal-oxide-silicon field-effect transistor (MOSFET) in which the gate is positioned in a trench formed on the surface of the silicon.

BACKGROUND OF THE INVENTION

Trench-gated MOSFETs are a class of MOSFETs in which the gate is positioned in a trench that is formed at the surface and extends into the silicon. The gate is formed in lattice-like geometric pattern which defines individual cells of the MOSFET, the pattern normally taking the form of closed polygons (squares, hexagons, etc.) or a series of interdigitated stripes or rectangles. The current flows in vertical channels which are formed adjacent to the sides of the trenches. The trenches are filled with a conductive gate material, typically doped polysilicon, which is insulated from the silicon by a dielectric layer normally consisting of silicon dioxide.

Two critical characteristics of a power MOSFET are its breakdown voltage, i.e., the voltage at which it begins to conduct current when in an off condition, and its on-resistance, i.e., its resistance to current flow when in an on condition. The on-resistance of a MOSFET generally varies directly with its cell density, since when there are more cells per unit area there is also a greater total "gate width" (around the perimeter of each cell) for the current to pass through. The breakdown voltage of a MOSFET depends primarily on the doping concentrations and locations of the source, body and drain regions in each MOSFET cell.

The MOSFET is typically formed in a lightly-doped epitaxial layer of silicon which is grown on a heavily-doped silicon substrate. The gate trenches normally extend into the epitaxial layer and are frequently rectangular, with flat bottoms bounded by corners. This configuration creates a problem in that, when the MOSFET is turned off, the electric field reaches a maximum near the corners of the gate trenches. This can lead to avalanche breakdown and impact ionization near the surface of the gate oxide, with the consequent generation of carriers. If the carriers are generated within a mean free path of the interface between the silicon and the gate oxide, they may have sufficient energy to pass through the interface and become injected into the gate oxide layer. Carriers that are able to surmount the silicon/silicon dioxide energy barrier are often referred to as "hot carriers." Hot carrier injection can ultimately damage the gate oxide layer, causing changes in threshold voltage, transconductance or on-resistance, and thereby impair or destroy the MOSFET.

U.S. Pat. No. 5,072,266 teaches a technique of suppressing voltage breakdown near the gate by the formation, in the MOSFET cell, of a deep central body diffusion that extends below the bottom of the trenches. This deep central diffusion shapes the electric field in such a way that breakdown occurs in the bulk silicon away from the gate, in a location which prevents hot carriers from reaching the gate oxide layer. A cross-sectional view of a MOSFET in accordance with U.S. Pat. No. 5,072,266 is shown in FIG. 1, which illustrates a MOSFET cell 10 containing a trenched gate 11, an N+ source region 12, an N+ substrate (drain) 13, an N-epitaxial layer 14, and a deep central P+ diffusion 15. Note that the lowest point of P+ diffusion 15 is below the bottom of gate 11.

The doping of deep P+ diffusion 15 is greater than the doping of P-body 16 in the region of the channel, designated by the dashed line and reference numeral 17. As a result, the distance $Y_S$ between the gate trenches must be maintained at or above a minimum value. Otherwise, the deep P+ dopant will diffuse into the channel 17 and raise the threshold voltage $V_{th}$ of the device. The value of $Y_S$, along with the thickness of the gate, defines the cell density and helps to determine the on-resistance of the MOSFET.

Moreover, the deep P+ diffusion limits the spreading of the current in the N-epitaxial region 14. FIGS. 15A and 15B show simulations of the current flow lines in a conventional MOSFET having a flat bottomed P-body region and a MOSFET having a deep P+ diffusion, respectively. The current lines in FIG. 15B are limited to a spreading angle (an analytical approximation used to describe the epitaxial current uniformity) of about 45 to 47 degrees (measured at the 95% flow lines), resulting in sub-optimum utilization of the N-epitaxial region and a higher specific on-resistance than in the device portrayed in FIG. 15A. The large current-spreading angle of the conventional device, which ranges from 73 to 78 degrees, achieves uniform conduction at a significantly shallower depth as estimated by the expression $x = (Y_{CELL} - Y_G) 2 \tan\theta$, where $\theta$ is the current spreading angle, $Y_{CELL}$ is the total width of the MOSFET cell, and $Y_G$ is the distance between the gate trenches. This relationship is pictured in FIG. 16. It has been found that the presence of the deep P+ region increases the depth at which uniform conduction is achieved in the N-epitaxial region from 0.5 microns to 1.6 microns.

To fabricate an extremely low voltage, low on-resistance power MOSFET, the dimensions of the device are generally scaled down. In particular, the cell density is increased and the epitaxial layer is made thinner, even to the point that the gate trenches may extend into the heavily-doped substrate. Such a MOSFET is illustrated as MOSFET 20 in FIG. 2A.

This creates an entirely new set of design criteria. Referring to FIG. 2A, since the corners 21C of the gate trenches 21 are surrounded by the N+ substrate 13, the electric field at these locations drops entirely across the gate oxide layer. While the formation of hot carriers in the silicon may be lower, the high electric field on the gate oxide layer may still lead to device degradation or damage. In one condition, when the gate is biased at essentially the same potential as the source and body (i.e., the device is turned off), a serious concern is that the gate oxide layer at the bottom of the trenches must support the entire voltage across the device. Compared to the embodiment of FIG. 1, there is no epitaxial layer to absorb a portion of this voltage difference.

An equivalent circuit for MOSFET 20 is shown in FIG. 2B. Diode $D_{DB}$ represents the PN junction between N-epitaxial layer 14 and P-body region 22, and capacitor $C_{GD}$ represents the capacitor across the gate oxide layer 21A.

SUMMARY OF THE INVENTION

The trench-gated MOSFET of this invention is formed in a semiconductor chip which includes a substrate alone or in combination with an overlying epitaxial layer. The gate of the MOSFET is formed in a trench which extends downward from the surface of the chip. The MOSFET includes a source region of a first conductivity type, a body region of a second conductivity type, and a drain region of the first conductivity type, which are arranged vertically along a side wall of the trench. The gate trenches may extend into the epitaxial layer, or through the epitaxial layer into the substrate.

The MOSFET is formed as a plurality of cells which are defined by the gate trench. The cells may be of any shape. For example, the cells may be in the form of a square or hexagon or a series of parallel stripes or rectangles.

In accordance with this invention, there is created in the chip a protective diffusion of the second conductivity type, which forms a PN junction with first conductivity material in the epitaxial layer or substrate. This PN junction functions as a diode. A metal layer ties the protective diffusion (i.e., one terminal of the diode) to the source regions of the MOSFET cells such that the diode is connected in parallel with the channels of the MOSFET cells.

In a preferred embodiment, the protective diffusion is formed in certain of the cells in a selected pattern across the MOSFET.

The protective diffusion of second conductivity type operates to reduce the strength of the electric field across the gate oxide and at the corners of the trenches and limits the formation of hot carriers in the vicinity of the trench, particularly in embodiments wherein the trenches extend into the epitaxial layer. Avalanche breakdown may be induced by any number of mechanisms (reachthrough, radius of curvature, etc.) so long as the avalanching region is spatially separated from the gate trench. The diode can also operate as a voltage clamp and thereby limit the voltage across the gate oxide layer, particularly in embodiments wherein the trenches extend into the substrate and the gate oxide must support the entire voltage drop across the MOSFET.

In a preferred embodiment, one cell containing a protective diffusion ("diode cell") is provided for a selected number of active MOSFET cells ("active cells"), in a repetitive pattern across the MOSFET. The number of diode cells per active cells is determined by the design criteria of the MOSFET. In general, for example, MOSFETs which are expected to experience breakdown more often will require a greater proportion of diode cells.

The presence of the diode cell also tends to carry a large portion of the drain-to-body diode current when the MOSFET is operated with its body diode forward-conducting. Such operation (called Quadrant III operation for an N-channel device) commonly occurs when an inductor or motor is driven by a push-pull or bridge-configured pair of MOSFETs. High diode currents in the active cells are undesirable since they may lead to minority charge storage, which complicates diode turn-off (forced diode reverse recovery) and may lead to snapback of the parasitic source-body-drain active cell NPN bipolar transistor when a high reverse voltage is once again applied across the device.

BRIEF DESCRIPTION OF THE DRAWING

FIG. 1 illustrates a cross-sectional view of a conventional trench-gated MOSFET containing a deep central diffusion to reduce the electric field at the corners of the trenches.

FIG. 2A illustrates a cross-sectional view of a conventional trench-gated MOSFET without a deep central diffusion and wherein the trenches extend into the substrate.

FIG. 2B illustrates an equivalent circuit diagram for the MOSFET of FIG. 2A.

DESCRIPTION OF THE INVENTION

Figure 3:
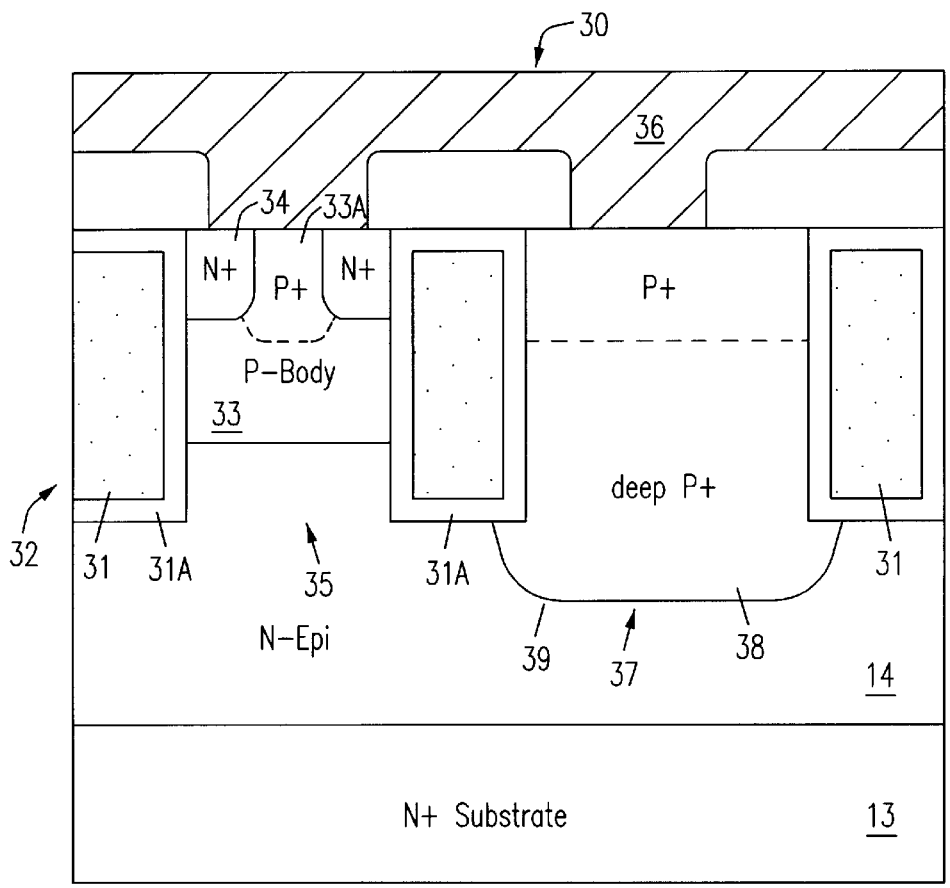
FIG. 3 illustrates a cross-sectional view of a first embodiment of this invention including a protective diffusion in an adjacent MOSFET cell.

A first embodiment of the invention is illustrated in FIG. 3. A trench-gated MOSFET 30 is formed in N-epitaxial layer 14, which is grown on the top surface of N+ substrate 13. A gate 31, formed in a trench 32, is separated from the semiconductor material by an oxide layer 31A. A cell 35 of MOSFET 30 also includes a P-body region 33, a shallow P+ contact region 33A, and an N+ source region 34. A metal layer 36 makes contact with and forms a short between P-body region 33 and N+ source region 34.

N+ substrate 13 serves as the drain of MOSFET 30 and may be contacted from the bottom. Alternatively, a submerged N+ layer instead of the N+ substrate could be used as the drain, and the drain could be contacted from the top side of the structure by means of, for example, an N+ sinker region and a top side contact.

In a neighboring cell 37 a protective deep P+ diffusion 38 is formed. Diffusion 38 forms a PN junction 39 with N-epitaxial layer 14. Metal layer 36 contacts protective diffusion 38, and thus PN junction 39 represents a diode which is connected in parallel with the channel of cell 35.

Protective diffusion 38 limits the strength of the electric field and resulting carrier formation near the corners of trench 32 and thereby eliminates the need for a deep central diffusion in MOSFET cell 35. With no deep central P+ diffusion, the dimensions of MOSFET cell 35 may be substantially reduced and the cell density of MOSFET 30 may be significantly increased. For example, the width of each side of N+ source region 34 may be reduced to about 1.0 μm, and the width of the contact between metal layer 36 and the P+ contact region for P-body 33 may be reduced to about 1.0 μm, so that the total width between trenches 32 may be on the order of 3.5 μm, although in practice the total width between trenches 32 might be set at 5.0 μm. This compares with a minimum width of about 8.0 μm for a MOSFET cell which contains a deep central diffusion (see FIG. 1).

Figure 4A:
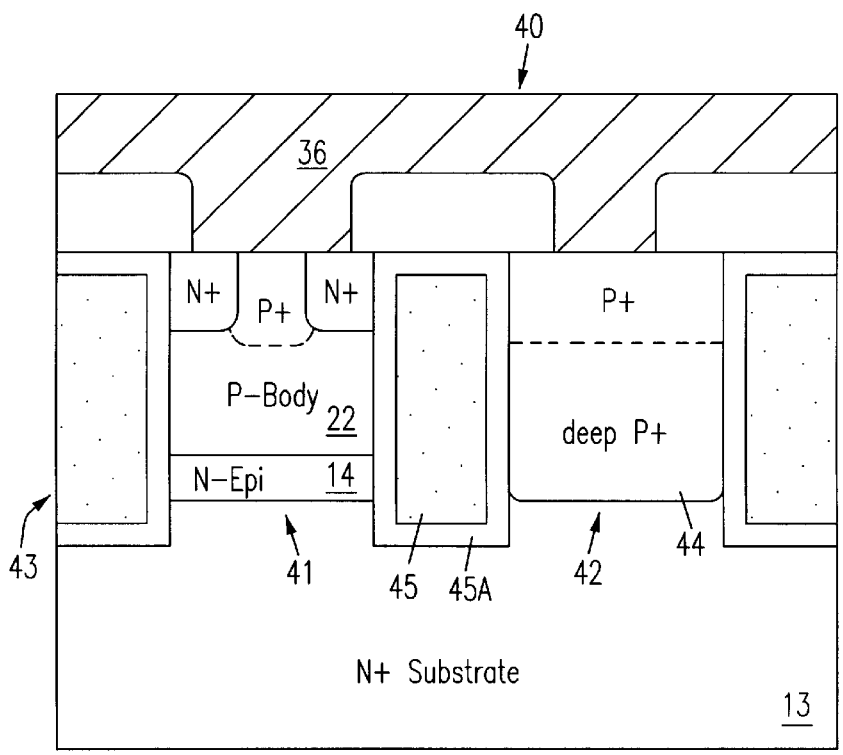
FIG. 4A illustrates a cross-sectional view of a second embodiment of this invention including a protective diffusion in an adjacent MOSFET cell and wherein the trenches extend into the substrate.

FIG. 4A illustrates a MOSFET 40 which includes a MOSFET cell 41 similar to the cell shown in FIG. 2A. That is, trenches 43 extend through the N-epitaxial layer 14 and into the N+ substrate 13, and cell 41 does not include a central deep P+ diffusion. In an adjacent cell 42, a protective P+ diffusion 44 is formed, with the lower junction of diffusion 44 reaching the top surface of N+ substrate 13.

Figure 4B:
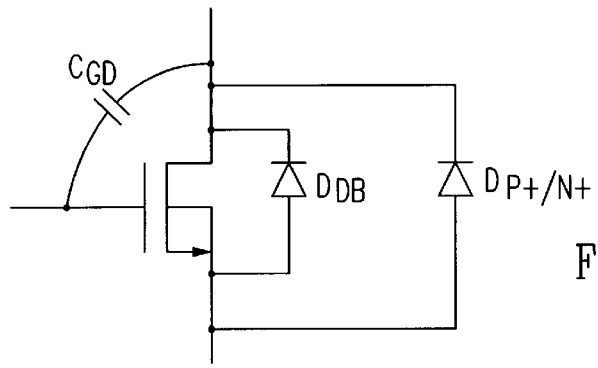
FIG. 4B illustrates an equivalent circuit diagram for the MOSFET of FIG. 4A.

FIG. 4B illustrates an equivalent circuit for MOSFET 40. Since the corners of trench 43 are located in the N+ substrate 13, which being heavily-doped cannot support a strong electric field, the problem of the electric field at the corners of the trenches is largely eliminated. Instead, the critical factor becomes the strength of the electric field between the gate 45 and the N+ substrate 13, i.e., across the gate oxide layer 45A. This location is represented by a capacitor $C_{GD}$ in FIG. 4B. The PN junction between P-body region 22 and N-epitaxial layer 14 is represented by a diode $D_{DB}$, and the PN junction between P+ diffusion 44 and N+ substrate 13 is represented by a diode $D_{P+/N+}$. As shown, both diode $D_{DB}$ and diode $D_{P+/N+}$ are connected in parallel with the channel of MOSFET cell 41.

Figure 5:
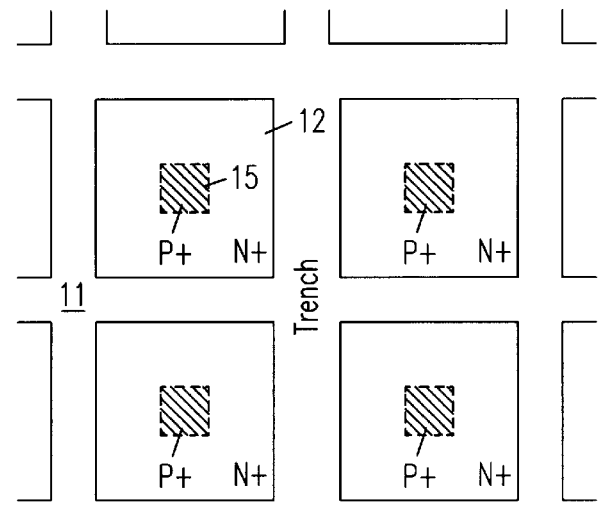
FIG. 5 illustrates a top view of a conventional MOSFET cell.

FIG. 5 shows a top view of the conventional MOSFET 10 shown in FIG. 1. The protective deep P+ region 15 is shown at the center of each square cell, surrounded by the N+ source region 12 and the gate 11. Four complete cells are shown in FIG. 5.

Figure 6:
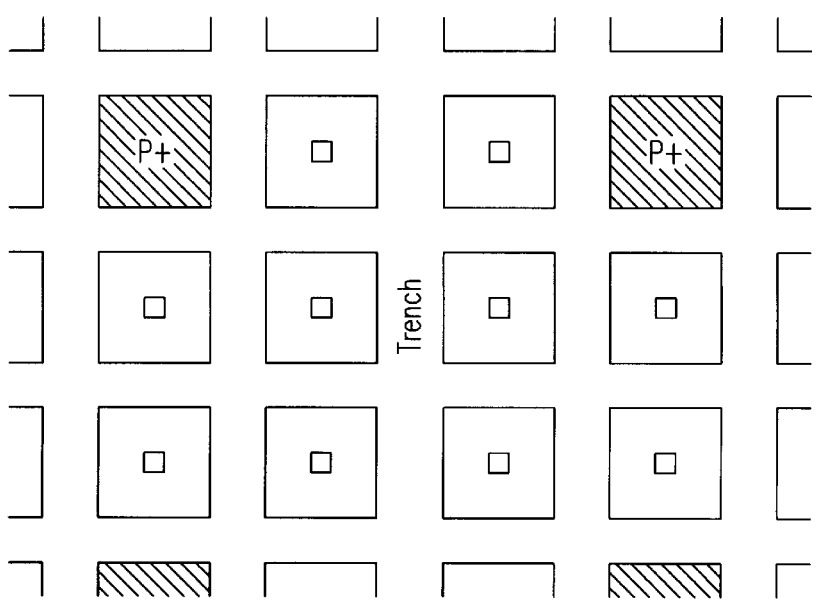
FIG. 6 illustrates a top view of a square-celled MOSFET in accordance with this invention.

FIG. 6 shows a top view of the MOSFET 30 shown in FIG. 3. A top view of MOSFET 40 shown in FIG. 4A would appear similar. Because the protective P+ region at the center of each cell has been eliminated, the dimensions of the cells have been reduced. The cells which contain the P+ diffusions (sometimes referred to as "diode cells") are also shown. In FIG. 6, there is one diode cell for every eight active MOSFET cells (total of nine cells).

Figure 7:
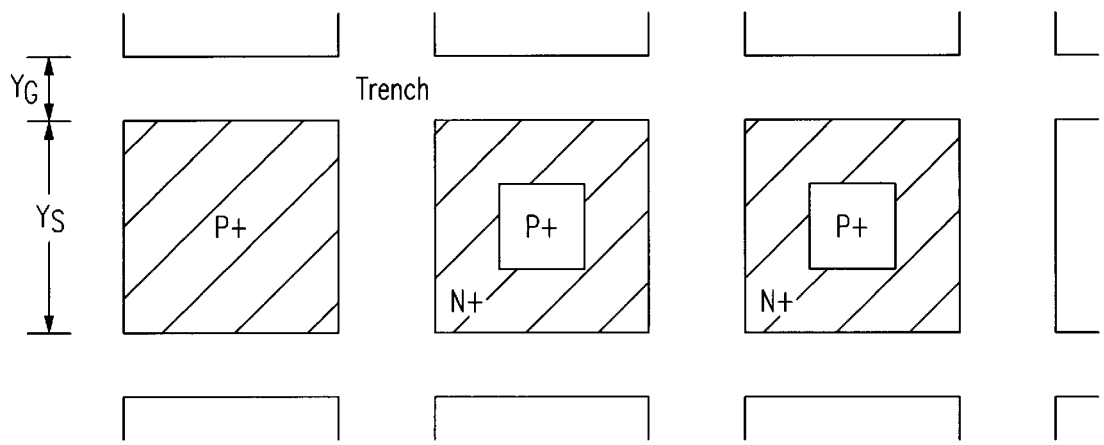
FIG. 7 illustrates a detailed top view of the square-celled MOSFET of FIG. 6.

FIG. 7 shows a detailed top view of three of the cells shown in FIG. 6 (two active MOSFET cells and one diode cell). In FIG. 7, $Y_S$ represents the distance between the trenched gates and $Y_G$ represents the cross-sectional width of the trench (not to be confused with the gate width W). Assuming that there is one diode cell for every n total cells, the following equation gives the total area A of the n cells:

$$A = (Y_G + Y_S)^2 + (n-1)(Y_G + Y_S)^2 = n(Y_G + Y_S)^2$$

Since n−1 of these cells are active MOSFET cells, the total gate width W in the n cells is equal to:

$$W=4Y_S(n-1)$$

Accordingly, the area-to-width ratio A/W (a figure of merit indicating how effectively a gate width W is packed into an area A) equals:

$$A/W=(Y_G+Y_S)^2$$

Thus the ratio A/W for a MOSFET which contains diode cells is increased by the factor n/(n−1), as compared with a conventional MOSFET with no diode cells. This "penalty" factor, which arises from the fact that the diode cells carry no current, approaches unity as n increases. The penalty is counterbalanced by the increased total gate width (and hence current-carrying capacity) which is obtained by increasing the cell density of the device. Generally, n is determined by the frequency with which the MOSFET is expected to break down. Devices which are expected to break down more frequently will generally require a lower n, i.e., there must be a greater number of diode cells relative to the total number of cells. In the extreme case where every other cell is an inactive (i.e., diode) cell, N=2 and n/n−1=2, the efficiency benefits of this structure are somewhat limited. On the other hand, if only one of every 21 cells is a diode, for example, n=21 and n/n−1=21/20, representing virtually no penalty for the diodes.

Figure 17:
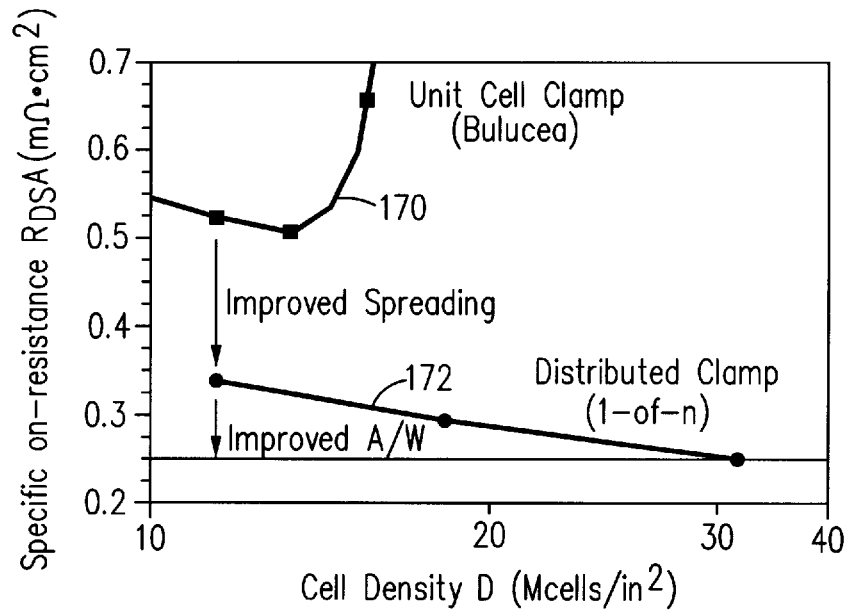
FIG. 17 illustrates a graph showing specific on-resistance as a function of cell density in a MOSFET having a deep central diffusion and in a MOSFET having distributed diode cells.
Figure 18:
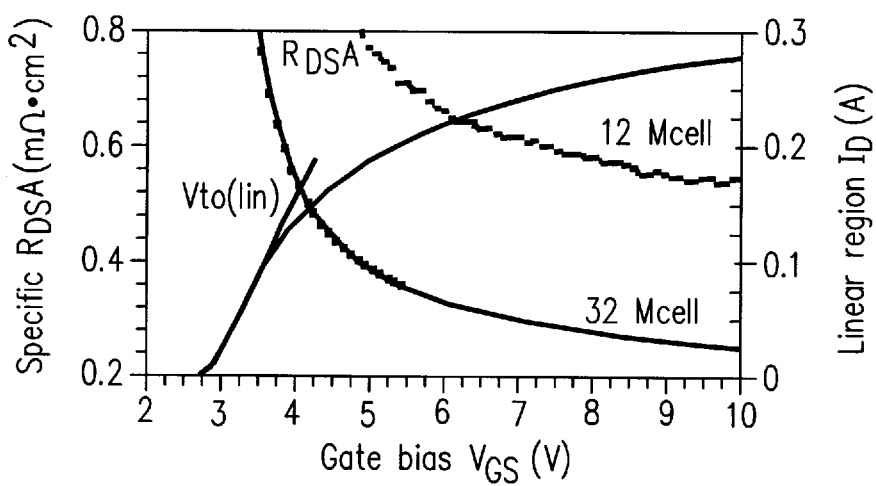
FIG. 18 illustrates a graph showing the variation of specific on-resistance as a function of gate bias for MOSFETs having a cell density of 12 Mcells/in$^2$ and 32 Mcells/in$^2$, respectively.

As noted above, the presence of a deep P+ region as taught by U.S. Pat. No. 5,072,266 limits the spreading of the current in the epitaxial region and thereby increases the on-resistance. FIG. 17 illustrates a graph showing specific on-resistance ($R_{DS}A$) as a function of cell density in a MOSFET having a deep P+ diffusion (curve 170) and a MOSFET having distributed diode cells (curve 172). As indicated, the specific on-resistance of the MOSFET containing deep P+ diffusions reaches a minimum after which it begins to increase as a result of current crowding and an increase in threshold voltage due to intrusion of the P+ body dopant into the channel. In the MOSFET with distributed diode cells a significant improvement in on-resistance is achieved because of improved current spreading, and further improvements are realized as the cell density increases. In the graph of FIG. 17 the on-resistance of the active flat-bottom cells improves 31% to 35 mΩ-cm$^2$, simply as a result of an increased current-spreading angle (see FIG. 17 at 12 Mcells/in$^2$). A further improvement of 28% is achieved by increasing the cell density to 32 Mcells/in$^2$, primarily as a result of improved channel resistance from a lower A/W factor. The net effect, the multiplicative product of these improvements, is roughly a 51% reduction in die resistance for a 30-V N-channel trenched gate MOSFET compared to its 12 Mcell/in$^2$ predecessor. FIG. 18 shows the variation of the specific $R_{DS}A$ as a function of gate bias for the two devices. For devices with a 20-V gate rating, the threshold voltage was maintained at 2.9 V consistent with rated operation at 10- and 4.5-V gate biases.

Figure 19A:
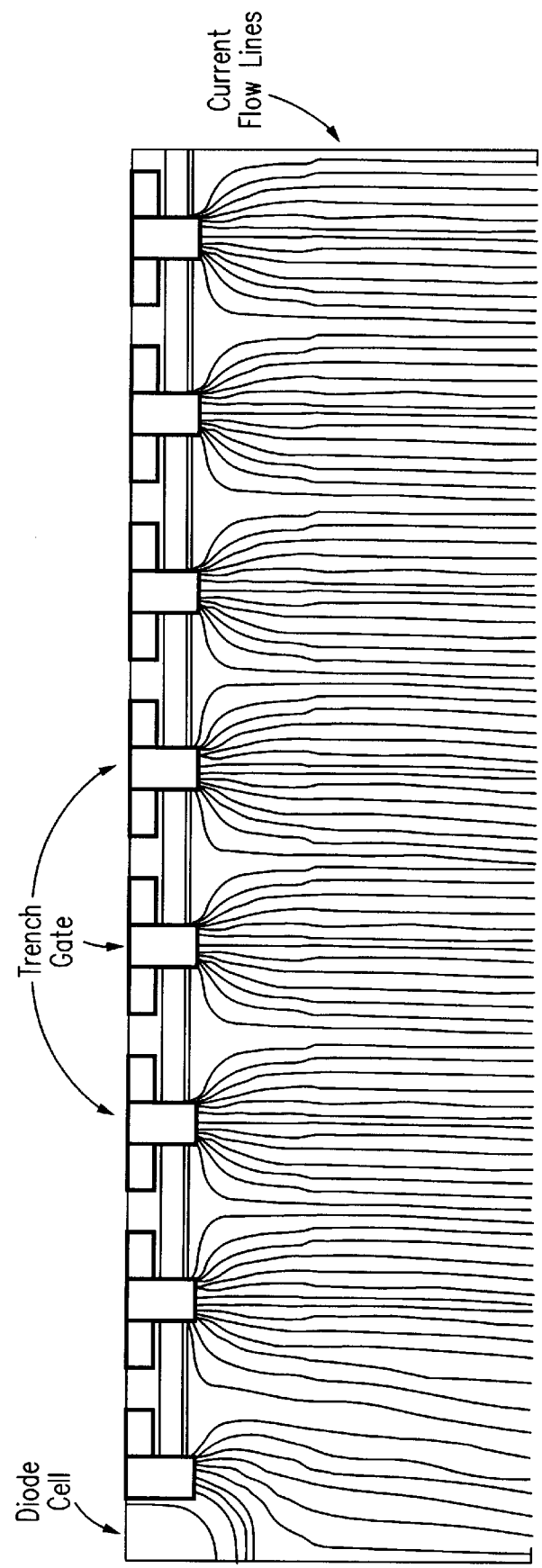
FIGS. 19A and 19B illustrate simulations of the current flow lines in a MOSFET operating in its linear region during normal conduction and in a MOSFET having a diode cell and experiencing avalanche breakdown.
Figure 19B:
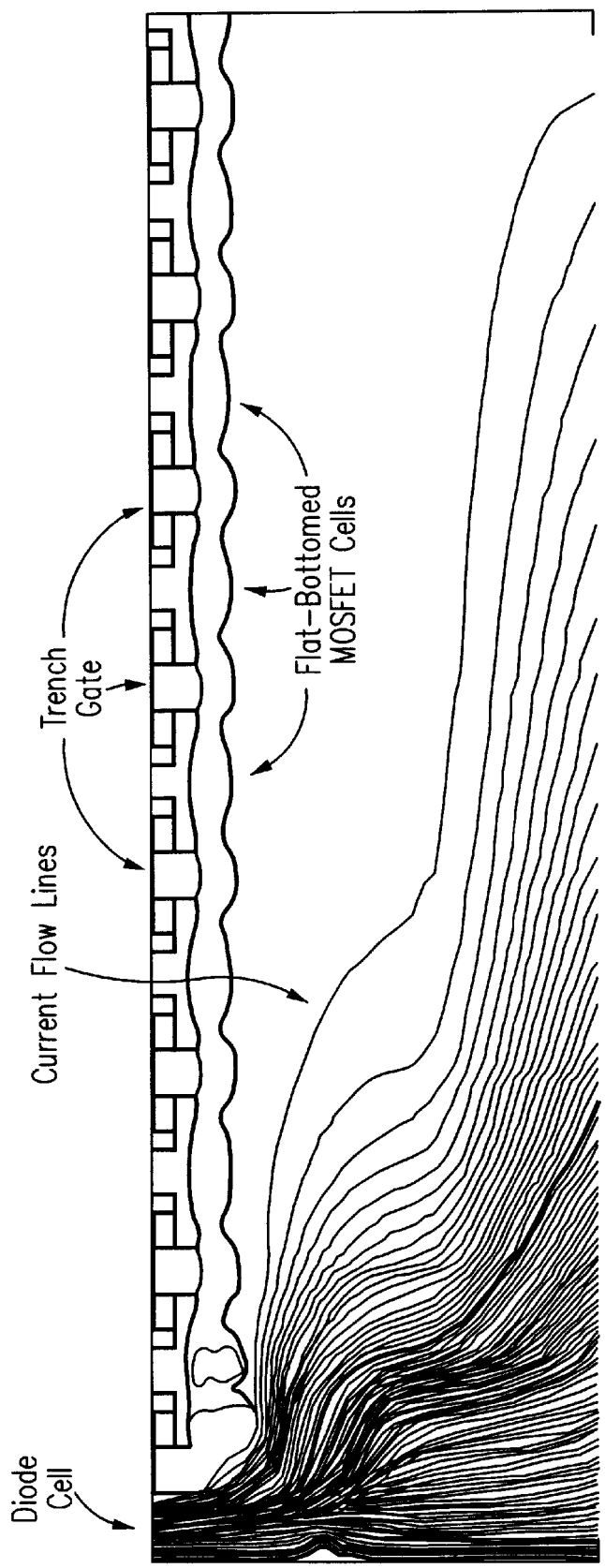

The avalanche capability of a 1-of-N clamped MOSFET was analyzed using a unclamped inductive switching (UIS) simulation. The device had one diode cell for every 16 active MOSFET cells. FIG. 19A illustrates the current flow lines of the device operating in its linear region during normal conduction before switching, and FIG. 19B illustrates the current flow lines after the device has been inductively switched. As shown, avalanche breakdown occurs in the diode cell, which conducts all of the current, without appreciable impact ionization, preavalanche or high gate oxide fields in the "off" active MOSFET cells.

EXAMPLE 1

Figure 20:
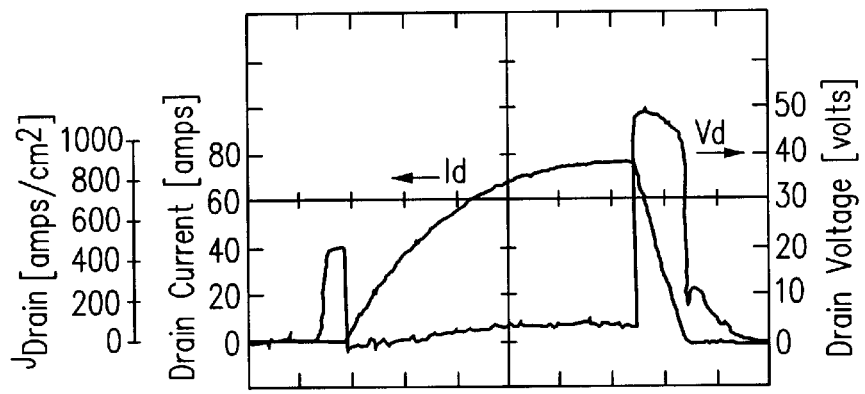
FIG. 20 illustrates a graph showing the unclamped inductive switching current and drain voltage in a MOSFET.

A test was performed using an SO-8 sized MOSFET rated for 10-A operation using an unclamped inductive switching (UIS) tester (AOT ILT-200 Inductive Load Tester). FIG. 20 shows that the measured UIS currents exceeded seven times the MOSFET's rated operating current, reaching current densities of over 950 A/cm$^2$. An increase in avalanche breakdown voltage during UIS from the nominal breakdown of 36 V (see FIG. 21) to 46 V was observed, with no damage to the MOSFET.

EXAMPLE 2

Figure 21:
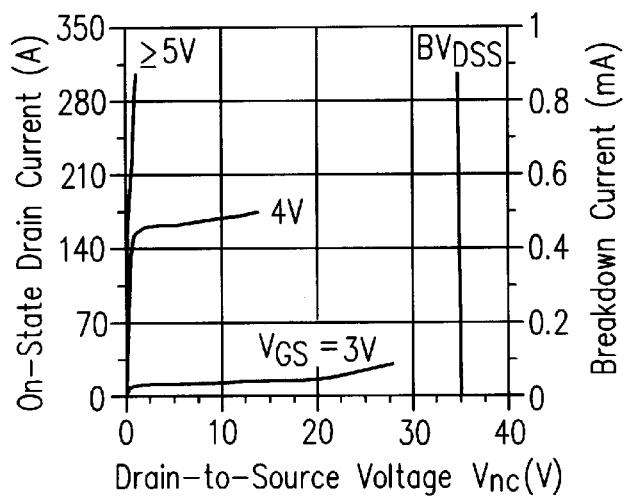
FIG. 21 illustrates a graph showing the measured I-V and breakdown characteristics of a MOSFET.
Figure 22:
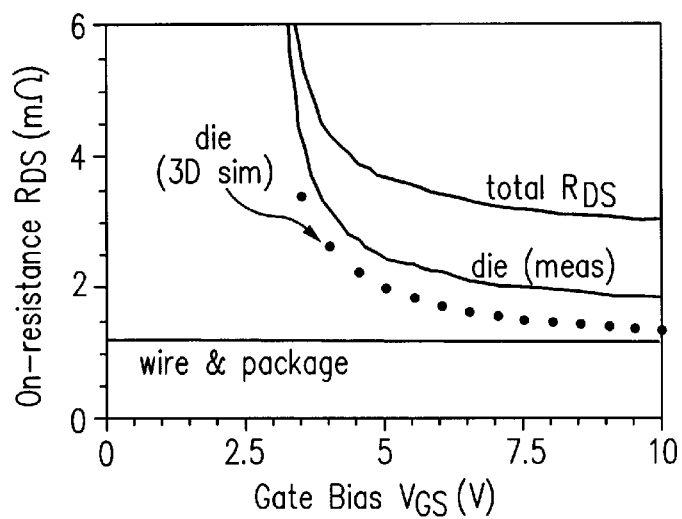
FIG. 22 illustrates a graph showing the on-resistance of various components of a packaged MOSFET as a function of gate bias.

Using the 32 Mcell/in$^2$ technology, a 0.574 cm×0.427 cm MOSFET sized for the D$^2$PAK type package was designed, fabricated and assembled. With 1,075,620 active MOSFET cells, this device was the first known power MOSFET to achieve the ULSI class of fabrication technology (>1 million transistors). As shown in FIG. 21, measured die exhibit saturation currents exceeding 140 A at a gate bias of 4.0 V and drain currents at 5 V which remain linear beyond 300 A (the limit of the tester). The gate charge was measured at 195 nC at Vgs=10 V and, as shown in FIG. 22, the corresponding packaged total on-resistance was 3.1 mΩ. After substrating the measured package resistance of 1.1 mΩ, the resulting die resistance of less than 2.0 mΩ is the lowest ever reported to our knowledge. On-resistance simulations and measurements on smaller die (see the circles in FIG. 22), however, suggest that spreading resistance in the MOSFET's top metal may account for an additional resistance of as much as 0.5 mΩ. Thus, the packaging typically accounts for 33% of the packaged product's total resistance. With a specific on-resistance of only 0.25 mΩcm$^2$, the 32 Mcell/cm$^2$ MOSFET has the lowest specific on-resistance of any 30-V power MOSFET ever fabricated to our knowledge, and it is not subject to the UIS, reliability and area-scaling limitations of other similar devices.

EXAMPLE 3

Figure 23A:
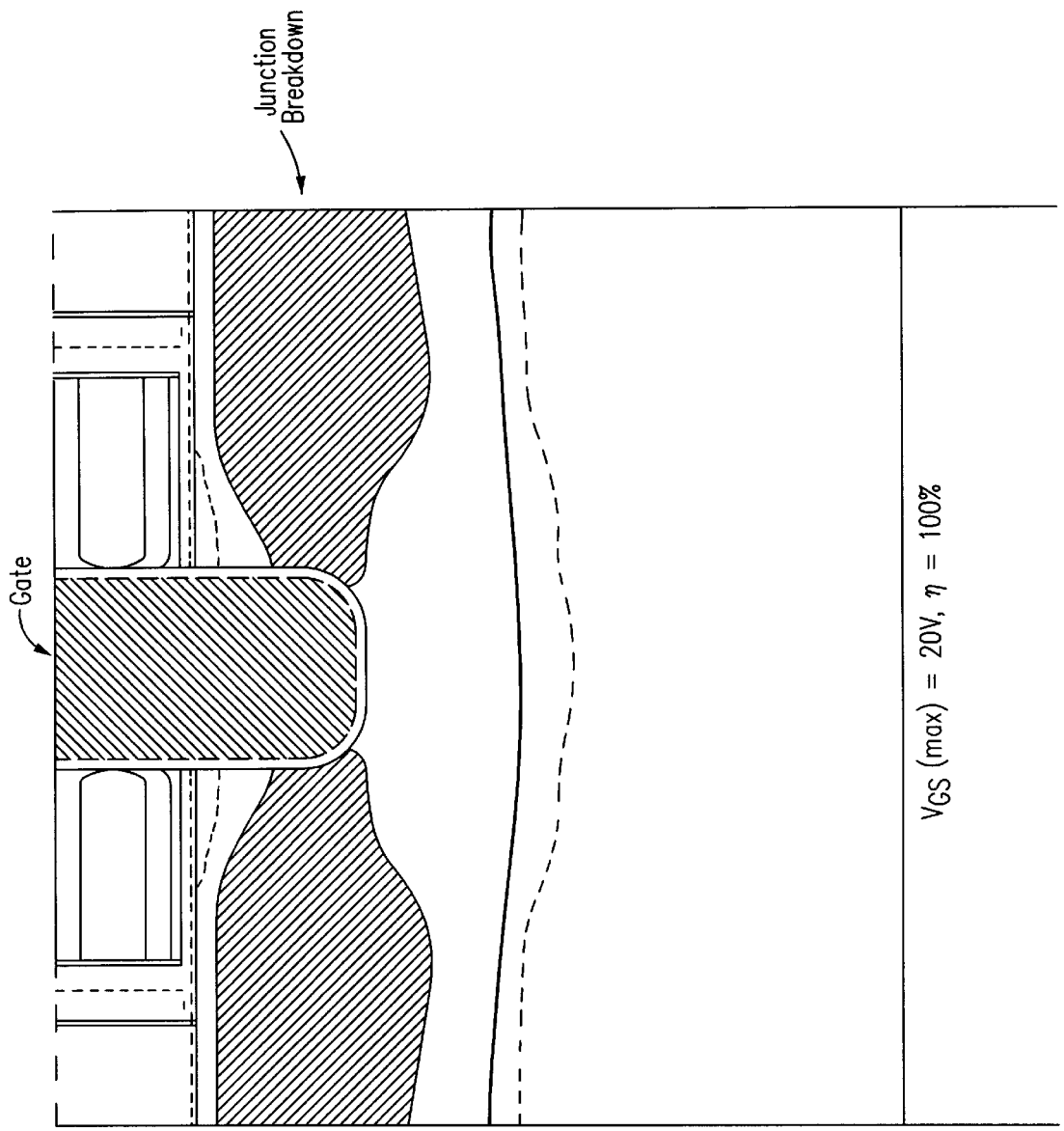
FIGS. 23A and 23B illustrate simulations showing the location of avalanche breakdown in flat-bottomed MOS- FETs having relatively thick and relatively thin gate oxide layers, respectively.
Figure 23B:
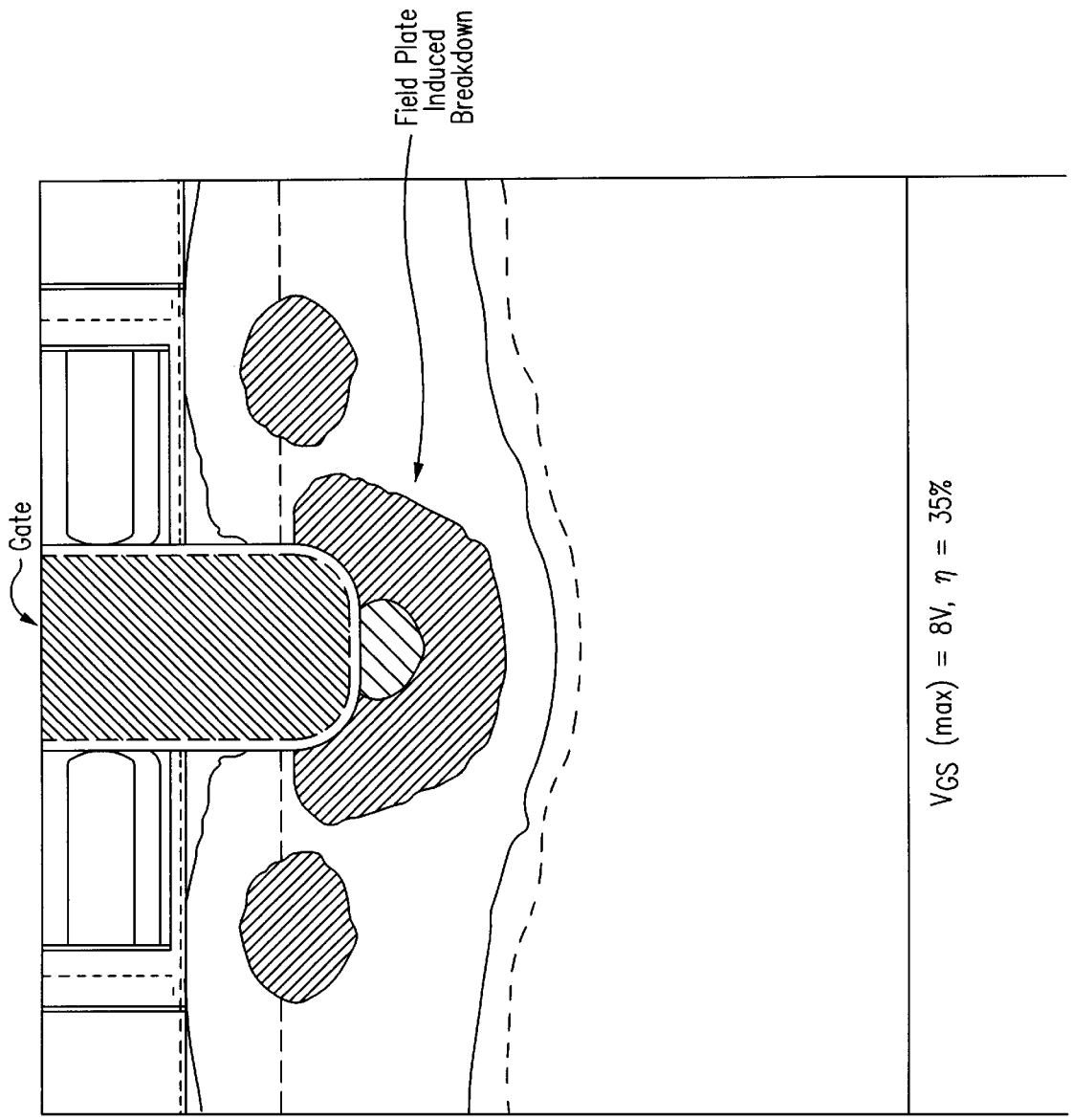
Figure 24:
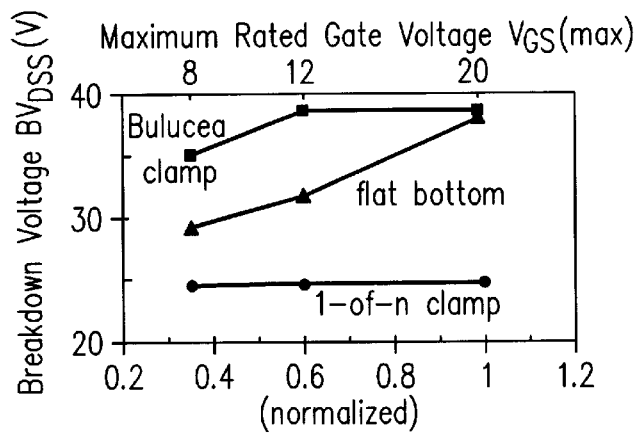
FIG. 24 illustrates a graph showing the breakdown voltage as a function normalized gate oxide thickness for a MOSFET having a deep central body diffusion, a MOSFET having a flat-bottomed body region, and a MOSFET having distributed diode cells in accordance with this invention.

Special problems are encountered in scaling the 1-of-N design for operation at low gate biases. When the gate oxide is thick, as for MOSFETs having rated gate oxide breakdown voltages of 20 V or more (defined herein as having a normalized oxide thickness η=100% or unity), the influence of the trench gate on the PN junction electric fields is minimal. As shown in FIG. 23A, even without voltage-clamping from a deep P+ diffusion as taught in the above-referenced Bulucea patent or from distributed diodes as taught herein, the MEDICI simulation of a P-channel device shows avalanche breakdown occurring at a PN junction. In order to optimize a MOSFET for low-voltage operation, however, the gate oxide layer must be down-scaled (i.e., thinned) both to achieve a low threshold voltage (without channel punchthrough) and to achieve a high channel transconductance. For thin gate oxides, for example where η=35% as shown in FIG. 23B, field plate induced (FPI) avalanche breakdown occurs at a location adjacent to the gate electrode not coincident with a PN junction, thereby lowering the breakdown voltage of the device and subjecting the gate oxide to the risk of hot carrier generation. For MOSFETs which contain a deep diffusion in accordance with the above-referenced Bulucea patent, the diode-clamped cell is less sensitive to FPI (see FIG. 24) as a result of the electrostatic shielding of the gate by the depletion regions associated with the deep diffusions. To protect MOSFET cells having a flat-bottomed body region, the breakdown voltage of the "1-of-N" diodes is set substantially below the voltage at which FPI breakdown occurs (FIG. 24). By overcoming the FPI problem, it is possible to take full advantage of the higher cell densities to improve the utilization of the epitaxial region and decrease the channel resistance (which dominates the total on-resistance at low gate biases).

Figure 25:
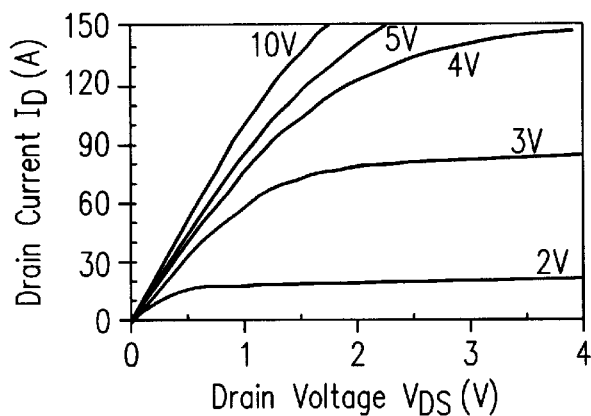
FIG. 25 illustrates a graph showing the I-V characteristic of a MOSFET.
Figure 26:
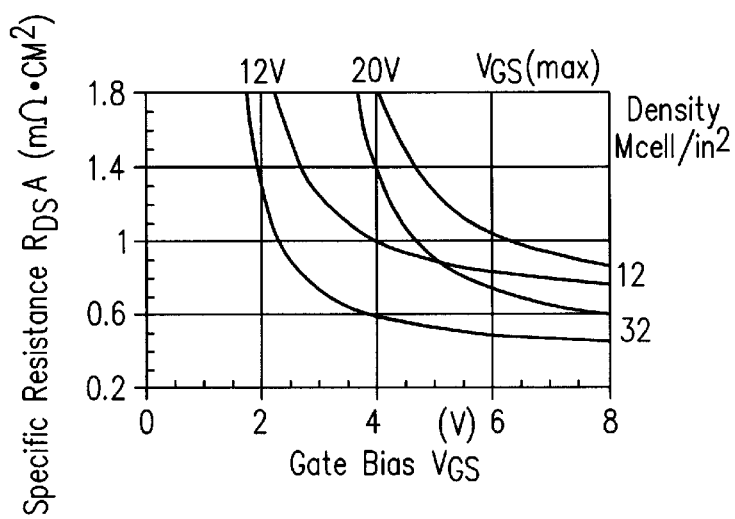
FIG. 26 illustrates a graph showing specific on-resistance as a function of gate bias for thin (12-V gate rated) and thick (20-V gate rated) oxide MOSFETs having cell densities of 12 Mcells/in$^2$ and 32 Mcells/in$^2$.

A P-channel MOSFET was fabricated in accordance with the "1-of-N" principles described herein. The drain of the MOSFET was designed, in accordance with known techniques, for operation at 20 V. The cell density was set at 32 Mcells/in$^2$, the gate oxide was thinned to η=60%, and the threshold voltage was set at 1.3 V. A die for a 10-A rated SO-8 sized package conducting over 50 A with a gate bias of only 2.5 V was used. FIG. 25 shows the I-V characteristics of the device. As shown in FIG. 26, the measure specific on-resistance was 850 $\mu\Omega$-cm$^2$ at a gate bias of 2.5 V and 750 $\mu\Omega$-cm$^2$ at a gate bias of 2.7 V. To our knowledge, these are the lowest on-resistances ever reported for a P-channel MOSFET at low gate bias (<3 V) operation. The measured on-resistance at a gate bias of 4.5 V was only 526 $\mu\Omega$-cm$^2$. The on-resistance of the SO-8 device was 11 m$\Omega$, which is to our knowledge the lowest on-resistance ever reported for a P-channel device at a gate bias of 4.5 V.

In conclusion, the regularly distributed inclusion of non-active deep P+ cells in a vertical trench FET provides a voltage clamping feature which limits the carrier generation rate and electric field at the corners or in the vicinity of the trench gate. The reliability and survivability of the device in the presence of electrical overstressing is thereby improved without limiting on-resistance or cell density. The deep P+ region need not extend to the trench edge but may be made smaller than its cell geometry if desired. The deep P+ region need not extend below the trench if the trench overlaps the N+ substrate, in which case a PIN diode may be formed between the deep P+ region and the N+ substrate (see FIG. 11). A graph showing the breakdown voltage of a PIN diode (such as diode D2 in FIG. 11) as a function of the doping concentration and width of the intermediate or "intrinsic" region is provided in S. M. Sze, *Physics of Semiconductor Devices*, Second Edition, John Wiley & Sons (1981), p. 105, FIG. 32, which is incorporated herein by reference.

Using the "one of n" technique of this invention, MOSFET cell dimensions can be significantly reduced, thereby increasing the cell density from 12 Mcell/in$^2$ to 32 Mcell/in$^2$ (5 Mcell/cm$^2$) without sacrificing the area or quality of the body contact. The parameter "n" can be varied from 2 (every other cell) to a large number such as 64 or more. The ability of the MOSFET to withstand avalanche breakdown can thus be controlled by design, with a penalty in on-resistance compared to a purely flat-bottom cell represented by the factor n/n−1. In many instances, this penalty factor can be adjusted to within a few percent of the ideal flat-bottom device.

Figure 8:
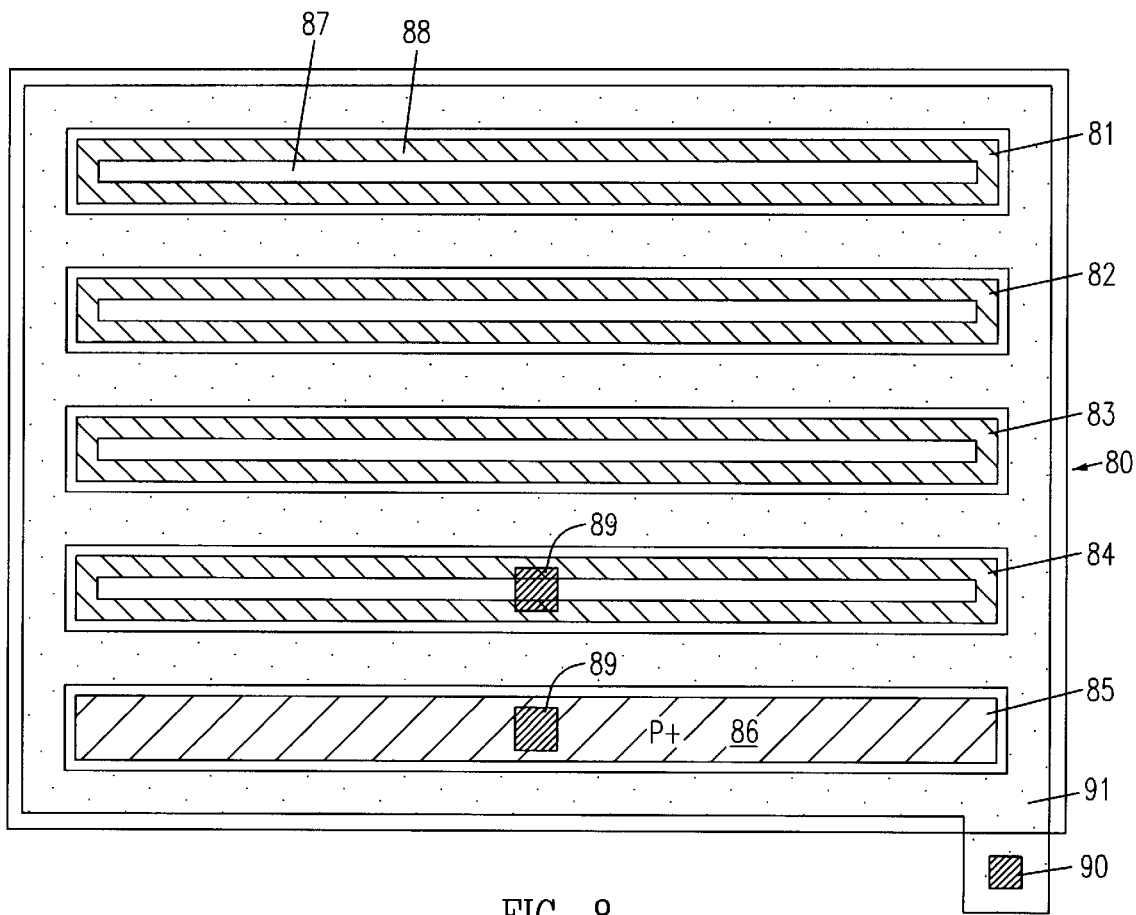
FIG. 8 illustrates a top view of a striped-cell MOSFET in accordance with this invention.

FIG. 8 illustrates a top view of an alternative MOSFET in which the cells are in the form of stripes. In MOSFET 80, cells 81, 82, 83 and 84 are active MOSFET cells, and cell 85 is a diode cell which contains a protective P+ diffusion 86. Each of cells 81–84 contains a P+ contact region 87 and an N+ source region 88. Contact holes 89, two of which are shown in FIG. 8, are used to provide contact between a metal layer (not shown) and P+ region 87 and N+ source region 88 in MOSFET cells 81–84 and P+ region 86 in diode cell 85. Contact holes 89 may be arranged in a variety of patterns over cells 81–85. A contact hole 90 for making contact with gate 91 is also shown.

Another use of the P+ diode cell is to clamp the drain voltage so as to protect the gate oxide layer from overstress due to excessive electric fields between the gate and the N+ substrate. This situation arises particularly in embodiments where the trench gate extends into the substrate and the gate oxide layer at the bottom of the trench is therefore exposed to the entire voltage difference between the gate and substrate. Silicon dioxide is capable of withstanding a voltage equal to about 8 MV/cm. Using a safety factor of 50%, the industry generally considers the maximum voltage that may be applied across a gate oxide layer to be $X_{OX}$.4MV/cm, $X_{OX}$ being the thickness of the gate oxide in centimeters. Accordingly, the breakdown voltage of the diode that is formed by the protective P+ diffusion should be no greater than $X_{OX}$.4MV/cm. For example, with an oxide layer having a thickness of 400 Å, the oxide layer will rupture at about 32V, and for reliable operation the maximum voltage should be limited to 16V.

Figure 9:
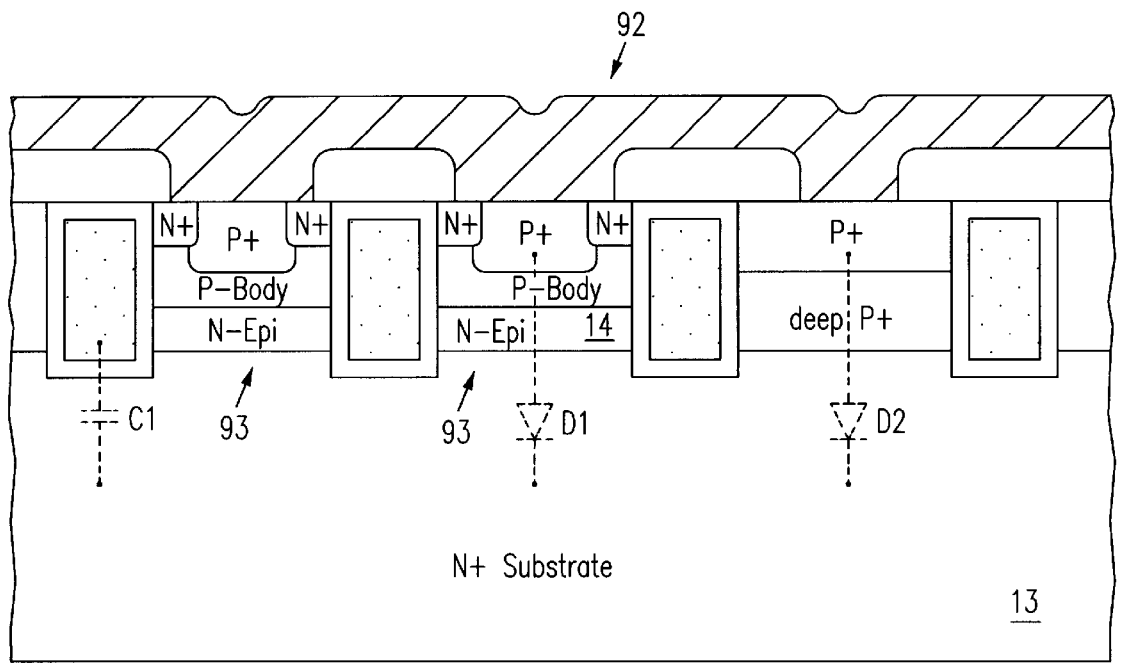
FIG. 9 illustrates another cross-sectional view of the second embodiment in accordance with this invention.
Figure 10:
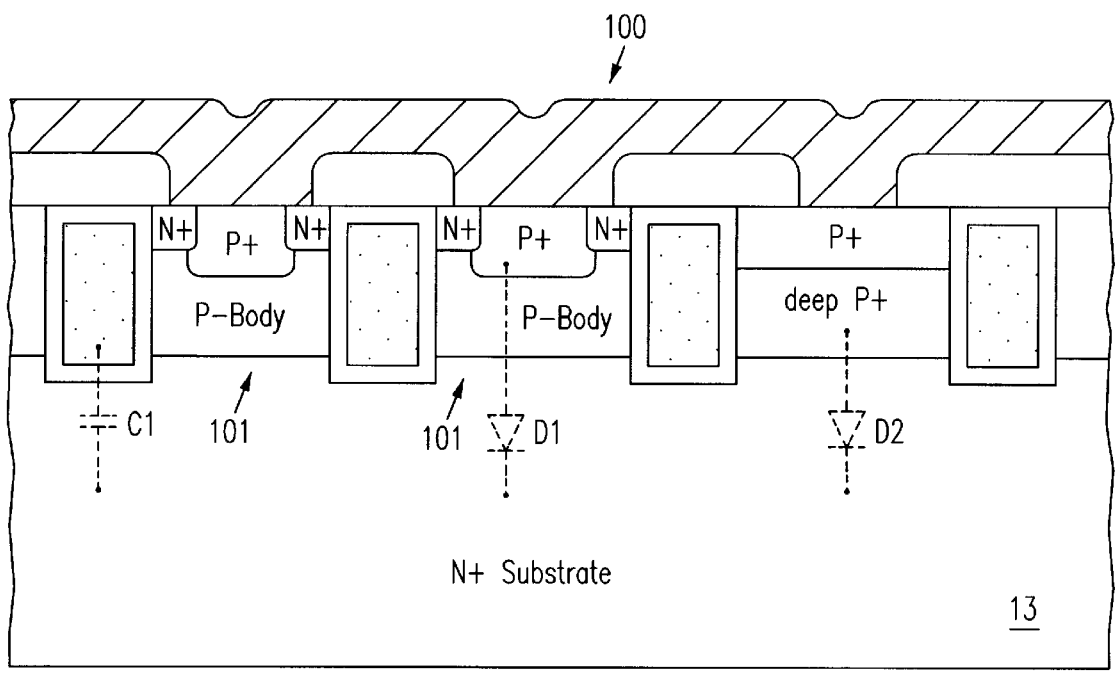
FIG. 10 illustrates a cross-sectional view of a third embodiment in accordance with this invention.
Figure 11:
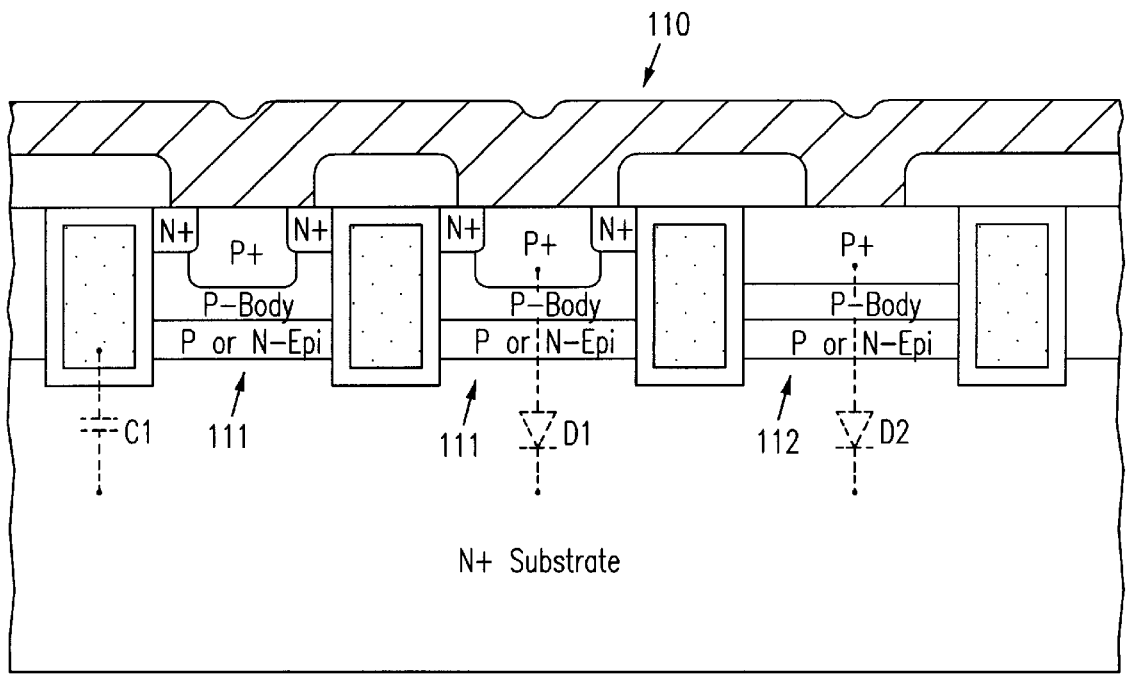
FIG. 11 illustrates a cross-sectional view of a fourth embodiment in accordance with this invention.

FIGS. 9–11 illustrate cross-sectional views of several alternative embodiments in accordance with the invention. FIG. 9 shows a MOSFET 92 in which the trenches extend into the N+ substrate 13. A thin layer of N-epitaxial layer remains in the MOSFET cells 93, while in diode cell 94 the protective P+ diffusion reaches the top surface of N+ substrate 13. In the MOSFET 100 shown in FIG. 10, the P-body regions in the MOSFET cells 101 extend to the top surface of the N+ substrate 13, and none of the N-doped region of epitaxial layer 14 remains. In the MOSFET 110 shown in FIG. 11, a thin section of the epitaxial layer 14, doped P- or N-, remains in each of the MOSFET cells 111 and the diode cell 112.

In FIGS. 9–11, diode D1 represents the PN junction within the MOSFET cells, diode D2 represents the PN junction in the protective diode cells, and a capacitor C1 represents the gate oxide layer abutted by the gate and the N+ substrate. In all three cases the relationship $BV_{D2}$<50% $BV_{C1}$ should hold, where $BV_{D2}$ is the breakdown voltage of diode D2 and $BV_{C1}$ is the breakdown voltage of capacitor C1. Also, the breakdown voltage of diode D2 is less than the breakdown voltage of diode D1 in each case.

Figure 12:
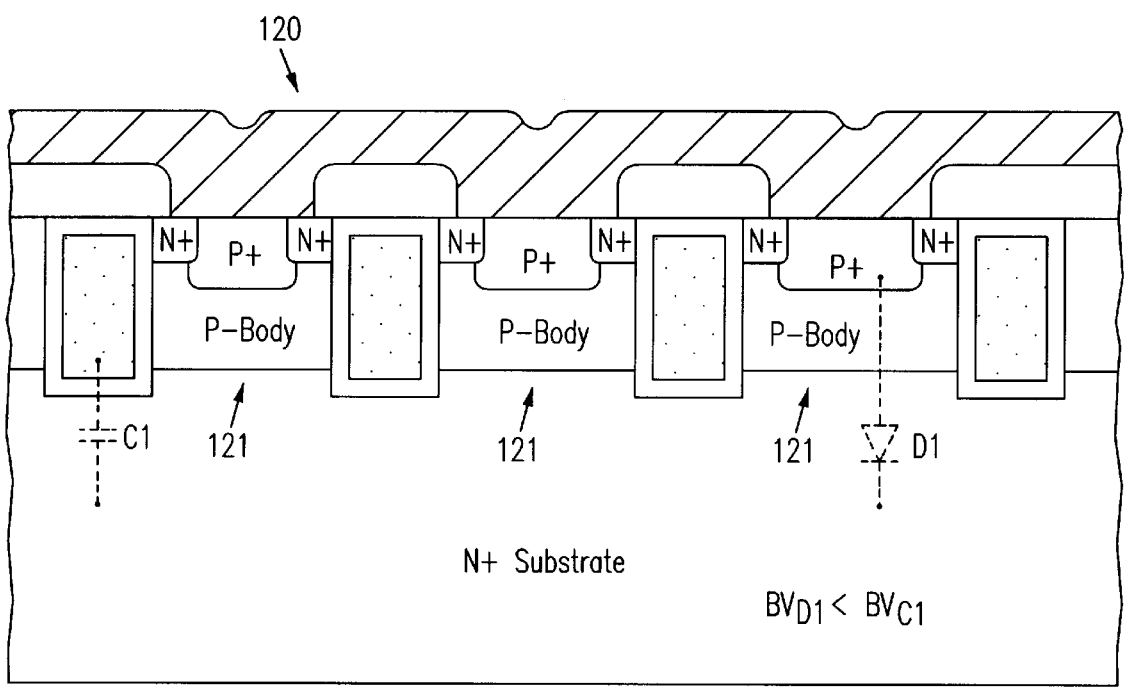
FIG. 12 illustrates a cross-sectional view of a fifth embodiment in accordance with this invention.

MOSFET 120, shown in FIG. 12, appears to be similar to the conventional MOSFET shown in FIG. 2A. Diode D1 represents the PIN diode formed at the center of each MOSFET cell by the combination of the shallow P+ contact region, the P-body and the N+ substrate. In MOSFET 120 the breakdown voltage of PIN diode D1 is set at less than 50% of the breakdown voltage of capacitors C1, wherein the breakdown voltage of the capacitors is calculated on the basis of 8 MV/cm for the thickness of the gate oxide layer expressed in centimeters. As a result, in MOSFET 120 breakdown will occur, if at all, in the central region of the individual cells and at a voltage which will not damage the gate oxide layers.

Figure 13A:
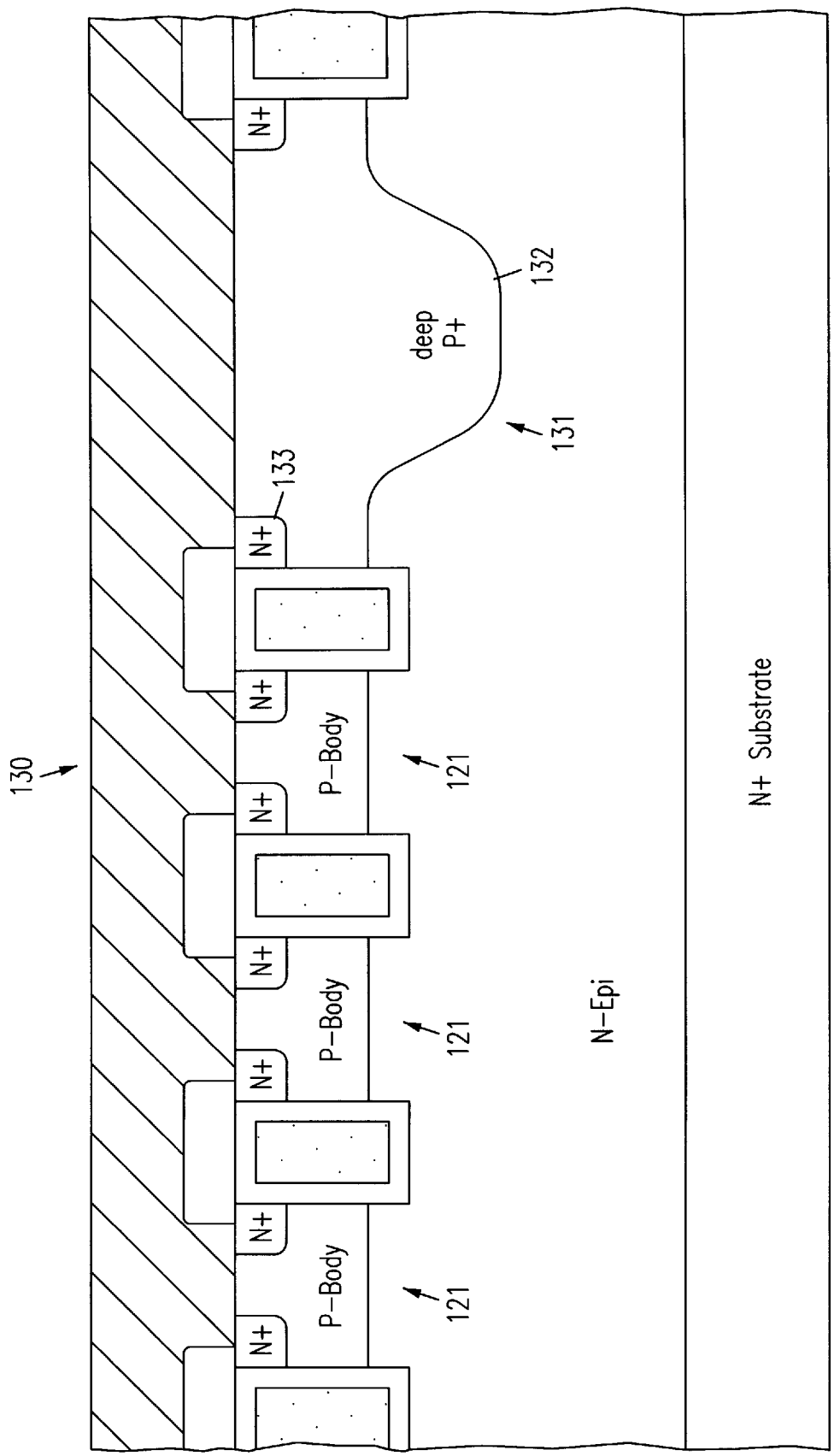
FIGS. 13A and 13B illustrate cross-sectional and top views, respectively, of a sixth embodiment, which includes a wide protective cell.
Figure 13B:
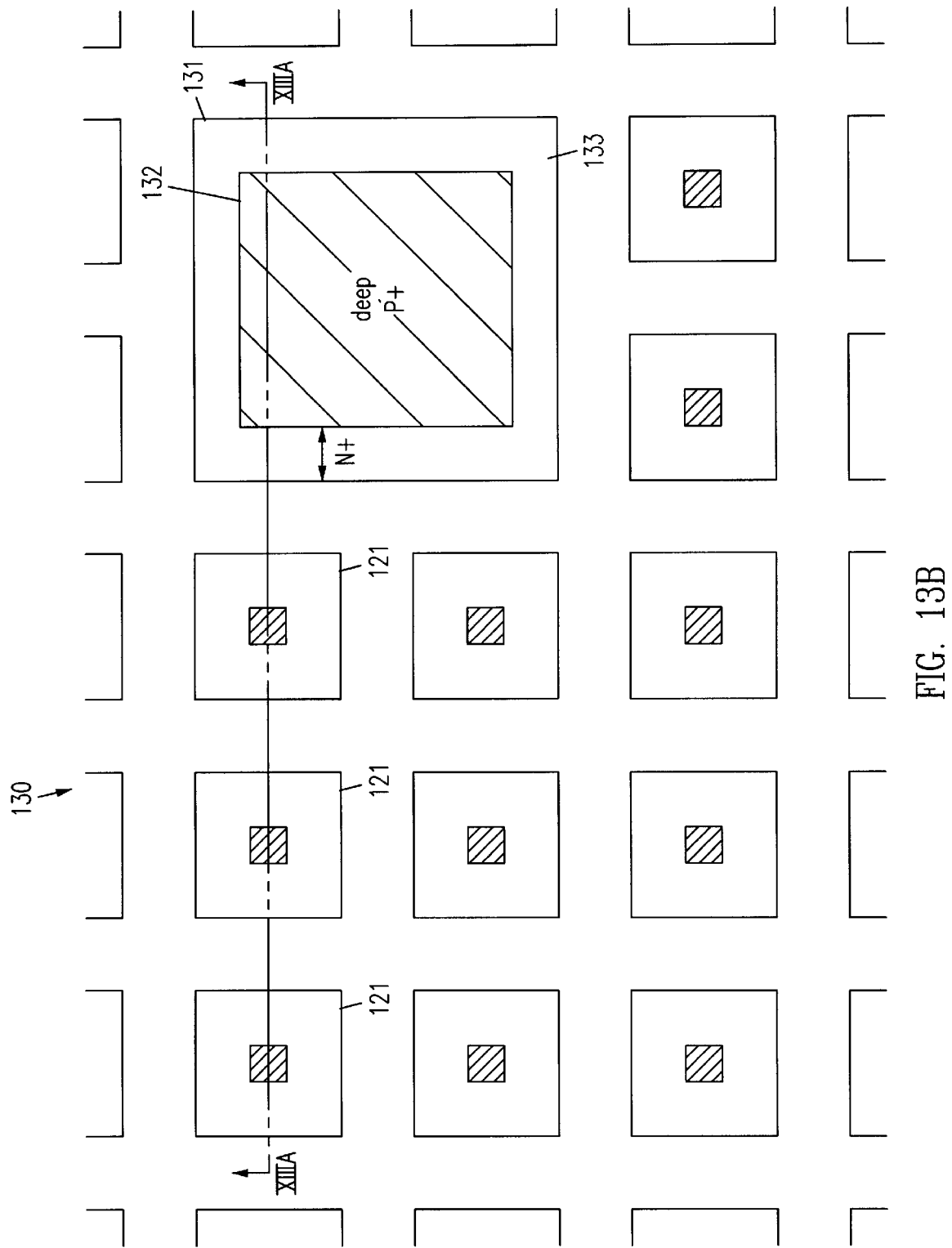

Another alternative embodiment is illustrated in FIGS. 13A and 13B, FIG. 13A being a cross-sectional view taken at section XIIIA—XIIIA shown in the top view of FIG. 13B. MOSFET 130 includes cells 121 as well as a wider cell 131 which includes a deep P+ region 132. Deep P+ region 132 provides a protective function for the gate oxide layers in cells 121 while acting as an active MOSFET cell itself, having an N+ source region 133. Thus, while cell 131 reduces the overall cell density of the MOSFET, the penalty in terms of on-resistance is less than it would be if cell 131 performed only a protective function and carried no current. As in MOSFET 120 of FIG. 12, cells 121 are typically smaller than they would be if a protective deep P+ region were included in each cell.

Although there are numerous processes for fabricating a MOSFET in accordance with this invention, FIGS.

14A–14E illustrate an exemplary process for fabricating MOSFET 30 shown in FIG. 3.

Figure 14A:
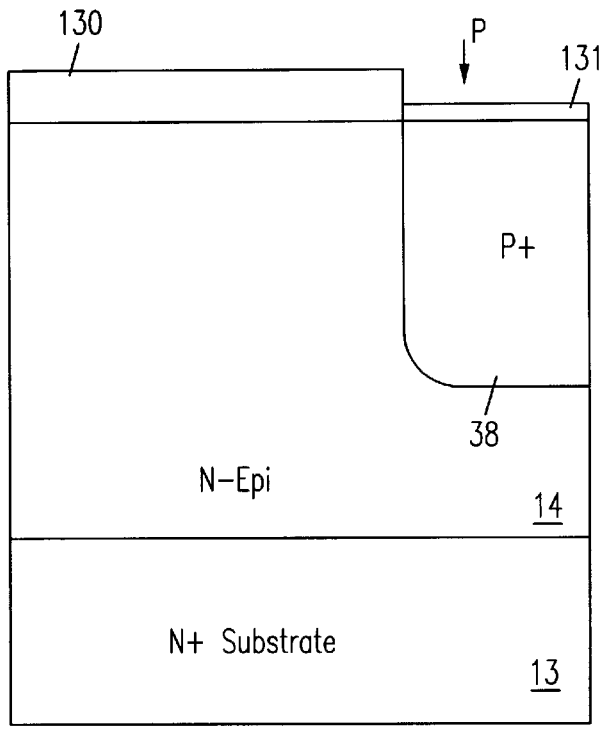
FIGS. 14A–14E illustrate the steps of a process of fabricating the MOSFET shown in FIG. 3.

Referring to FIG. 14A, the starting point is a conventional N+ substrate 13 on which an N-epitaxial layer 14 is grown using known processes.

A thick oxide layer 140 is grown, masked and etched, and a thin oxide layer 141 is grown on the top surface of the structure where deep P+ region 38 is to be formed. Deep P+ region 38 is then implanted through thin oxide layer 141 at a dose of $1 \times 10^{14}$ to $7 \times 10^{15}$ cm$^{-2}$ and an energy of 60–100 keV. The resulting structure is illustrated in FIG. 14A. Oxide layers 140 and 141 are then removed.

Figure 14B:
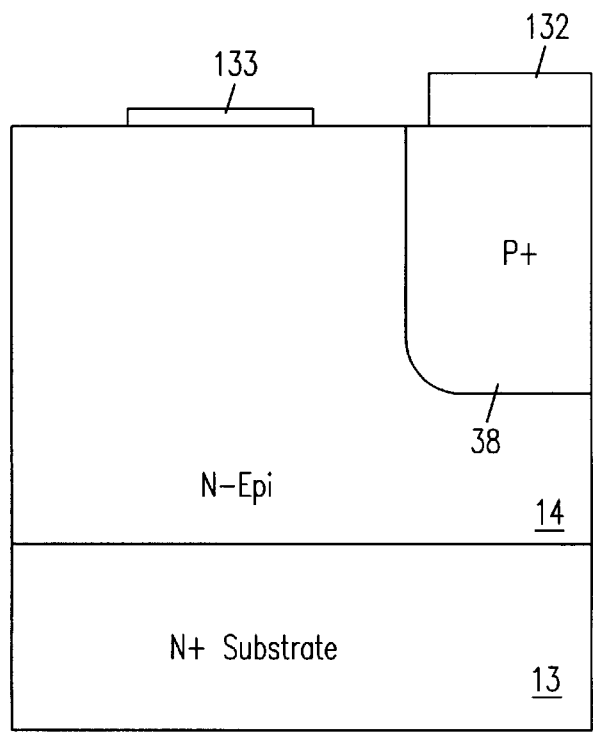

In one version of the process, a thick oxide layer 142 is grown and removed by photomasking except over deep P+ region 38, and a thin oxide layer 143 is grown. Thin oxide layer 143 is masked and removed from the portions of the structure where the trenches are to be formed, as shown in FIG. 14B. The trenches are then masked and etched using known techniques of reactive ion or plasma dry etching. Then the trench is oxidized to form gate oxide layer 31A, and polysilicon is deposited into the trench until it overflows the top of the trench. The polysilicon is then doped with phosphorus by POCl$_3$ predeposition or ion implantation at a dose of $5 \times 10^{13}$ to $5 \times 10^{15}$ cm$^{-2}$ and an energy of 60 keV, giving it a sheet resistance of 20–70 Ω/sq. For a P-channel device, the polysilicon is doped with boron using ion implantation to a sheet resistance of roughly 40–120 Ω/sq. The polysilicon is then etched back until it is planar with the surface of the trench except where a mask protects it, so that it can subsequently be contacted with metal.

Figure 14C:
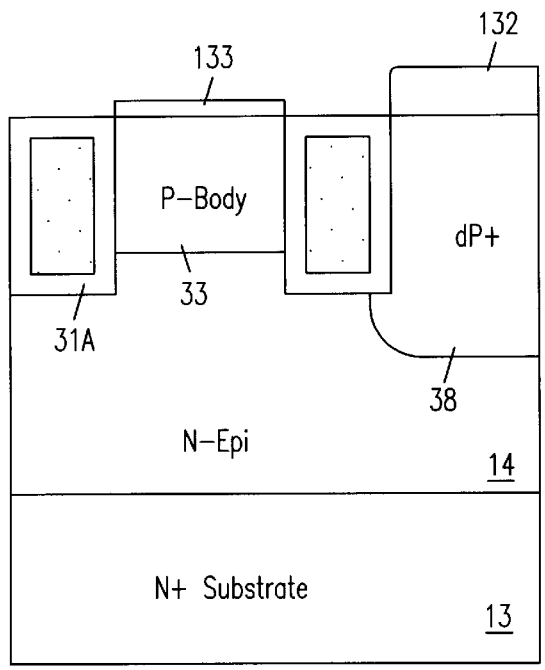

P-body 33 is then implanted through the thin oxide layer 143 (e.g., boron at a dose of $1 \times 10^{13}$ to $4 \times 10^{14}$ cm$^{-2}$ and an energy of 40–100 keV). A similar method is used in fabricating a P-channel device except that the dopant is phosphorus. The resulting structure is illustrated in FIG. 14C.

Figure 14D:
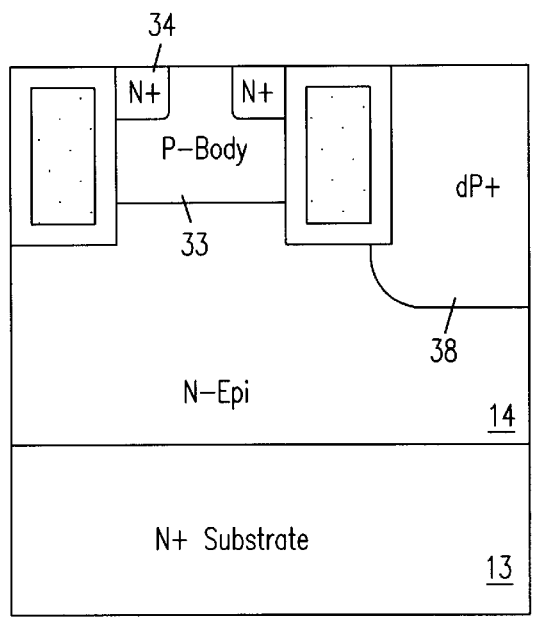

The N+ source region 34 is then introduced using a mask and an arsenic ion implantation (or a boron ion implantation for a P-channel device) at a dose of $5 \times 10^{14}$ to $1 \times 10^{16}$ cm$^{-2}$ at 20 to 100 keV. The resulting structure is shown in FIG. 14D.

Figure 14E:
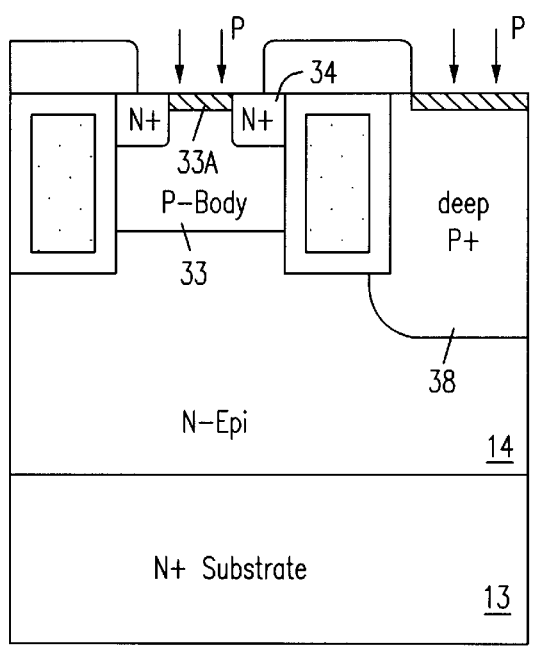
Figure 15A:
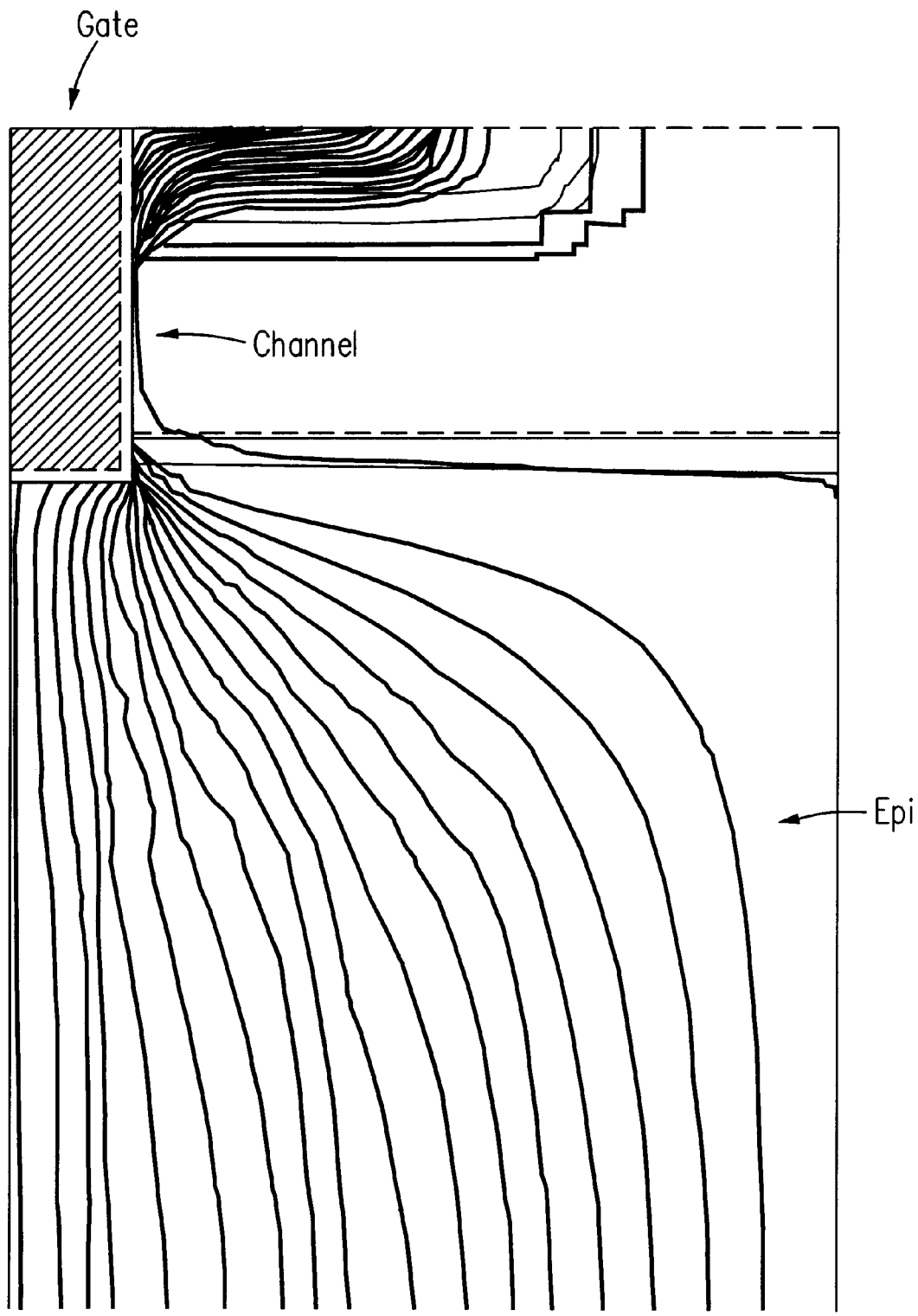
FIGS. 15A and 15B illustrate simulations of the current flow lines in a MOSFET having a flat-bottomed body region and a MOSFET having a deep central body diffusion as taught in U.S. Pat. No. 5,072,266, respectively.
Figure 15B:
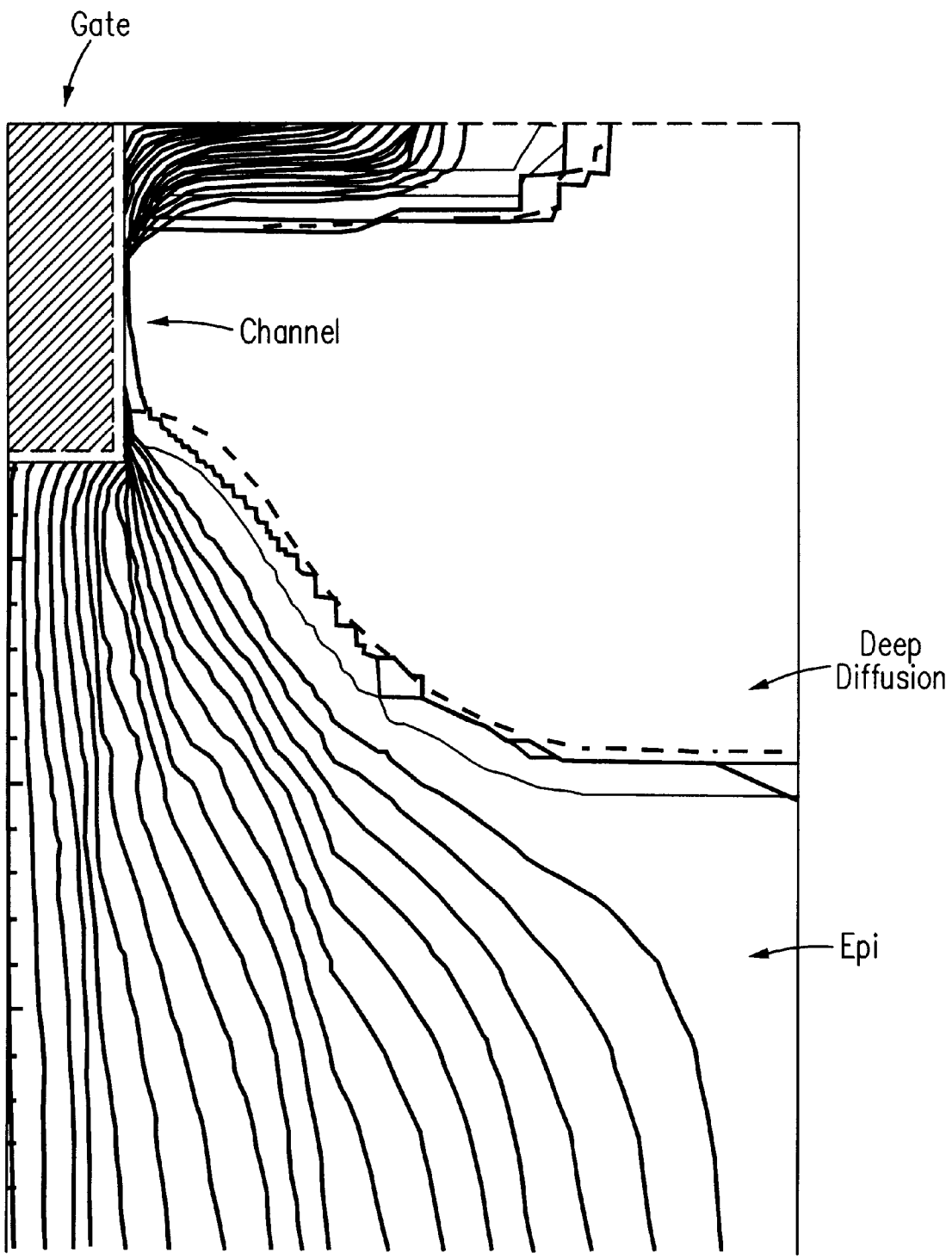
Figure 16:
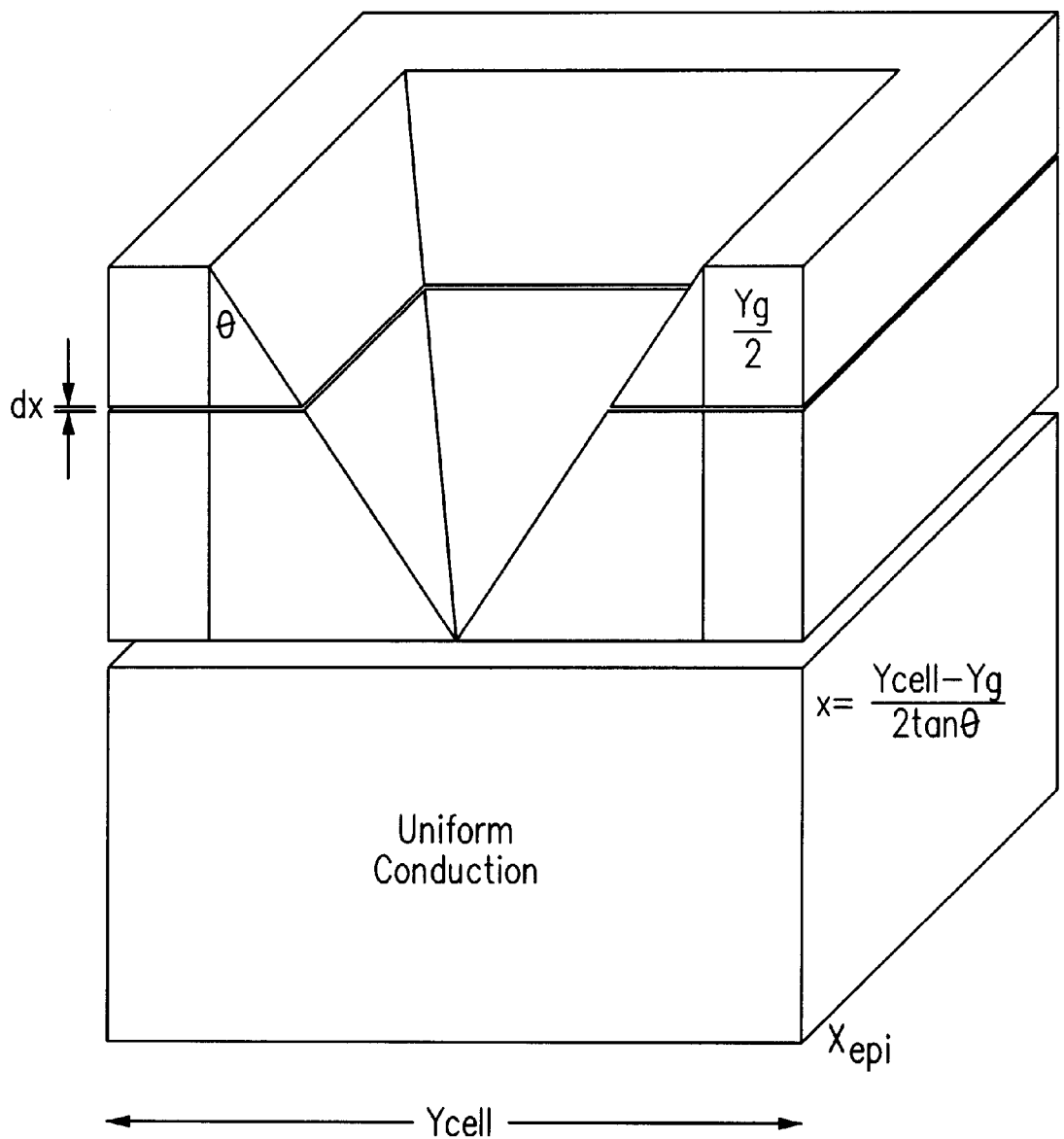
FIG. 16 illustrates a view of a MOSFET which shows the geometrical relationship between the current-spreading angel and the depth within the epitaxial layer at which uniform conduction is achieved.

Following the formation of the N+ source region 38, a new mask is formed and the shallow P+ region 33A that is used to contact the P-body is introduced by ion implantation at a dose of $1 \times 10^{13}$ to $5 \times 10^{14}$ cm$^{-2}$ at 20–80 keV. Alternatively, as shown in FIG. 14E, shallow P+ region 33A can be formed by implanting P-type dopant through the same mask that is used in forming the contact holes for the N+ source region/P+ contact region and the deep P+ region. Although with this technique some of the P-type dopant is implanted into N+ source region 34, the level of P-type doping is not sufficient to significantly affect the concentration of N-type ions in the N+ source region.

A thin oxide layer is thermally grown. Borophosphosilicate glass (BPSG) is then deposited on the surface of the structure. The BPSG is momentarily heated to around 850° to 950° C. to flow smoothly and flatten the surface topology of the die. Contact holes are etched in the oxide and BPSG layers, and metal layer 36 is deposited, forming contacts with the source and body regions and the deep P+ region through the contact holes. This yields MOSFET 30 shown in FIG. 3.

The die is then passivated with SiN or BPSG, and pad mask windows are etched to facilitate bonding.

A series of simulations and experiments were performed to determine the ranges of parameters that would produce a family of commercially acceptable products: 20-V and 30-V rated drain potentials, 12-V and 20-V rated gate potentials, and N-channel and P-channel devices. It was desired to identify the ranges of parameters that would yield a device in which the "1-of-N" diode cells would break down before the MOSFET cells. Two approaches were employed: (i) a "reachthrough" approach which involved the use of a PIN type diode with the breakdown voltage determined primarily by the thickness of an intermediate layer; and (ii) a "stepped epi" approach in which an epitaxial layer including two sublayers was used, with the deep diffusion in the diode cell overlapping into the lower of the sublayers.

Figure 27:
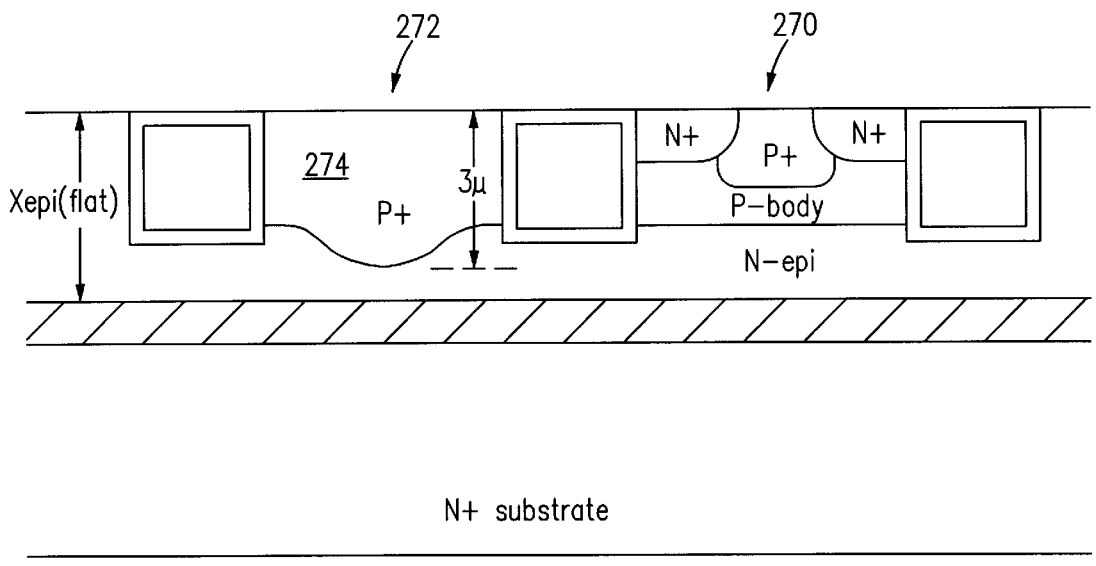
FIG. 27 illustrates a cross-sectional view of a "reachthrough" type of MOSFET structure, including a MOSFET cell and a diode cell.

The initial set of tests dealt with a "reachthrough" structure of the type illustrated in FIG. 27, which includes a MOSFET cell 270 and a diode cell 272. The diode cell includes a deep P+ diffusion 274 which extends 3 μm below the surface of the epitaxial layer. FIG. 27 shows an N-channel device; a P-channel device would have the same general structure but the conductivities would be reversed.

Figure 28:
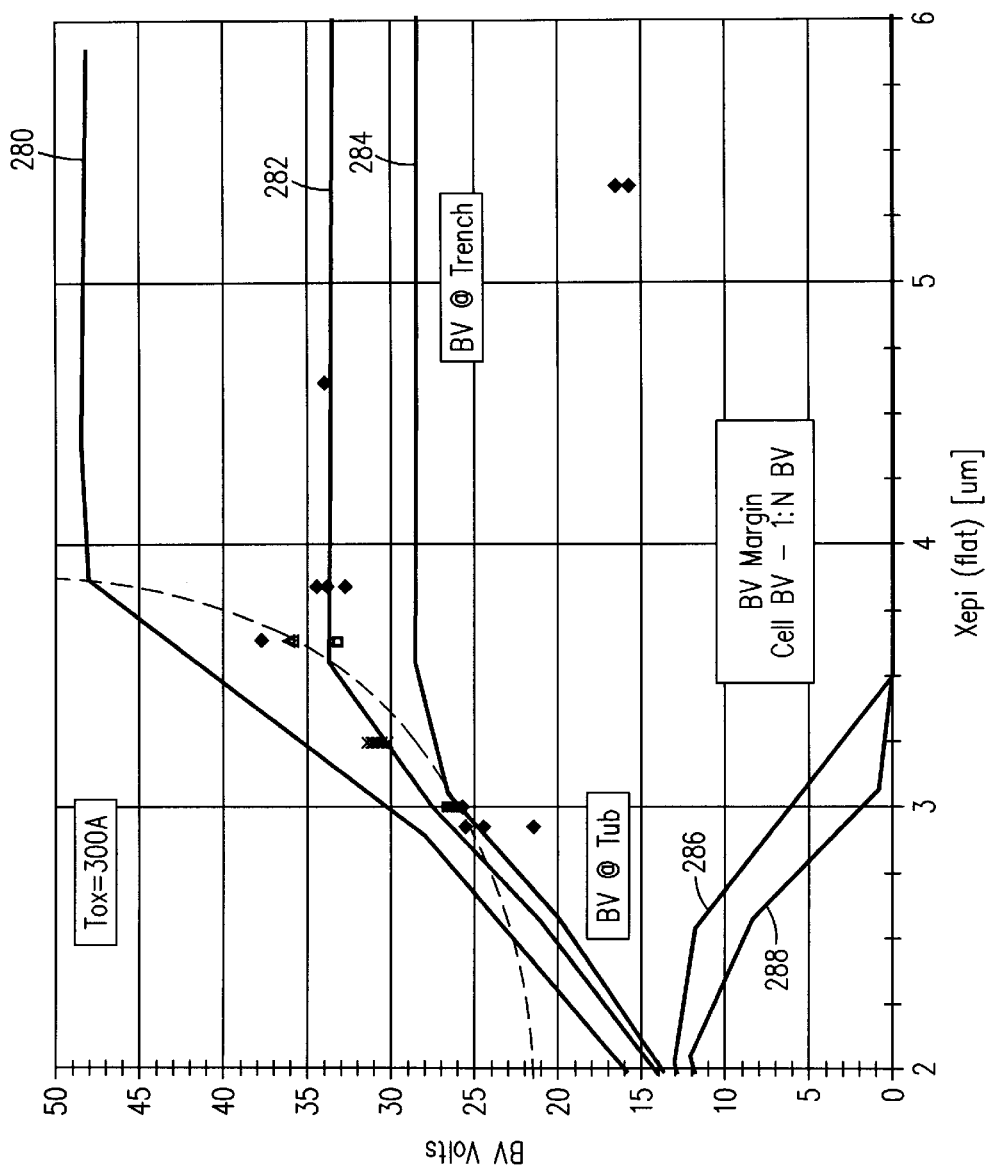
FIG. 28 illustrates a graph showing the breakdown voltage as a function of the epitaxial layer thickness 20-V drain, 12-V gate, N-channel MOSFET using the "reachthrough" approach.

The results of the tests are shown in the graph of FIG. 28, wherein the vertical axis is the breakdown voltage and the horzontial axis, ranging from 2 to 6 μm, is the "flat" portion of the epitaxial layer (Xepi(flat)), i.e., the portion where in the concentration of N-type dopant is relatively constant, before it begins to increase in the transition region between the N-epitaxial layer and the N+ substrate. This transition region is indicated by the hatched area 276 in FIG. 27.

FIG. 28 shows test data relating to 20-V drain, 12-V gate, N-channel device. A first set of curves 280, 282 and 284 indicate the breakdown voltage of the device when the dopant concentration in the N-epitaxial layer is $1.0 \times 10^{16}$ cm$^{-3}$, $2.0 \times 10^{16}$ cm$^{-3}$ and $3.0 \times 10^{16}$ cm$^{-3}$, respectively. The thickness of the gate oxide layer was 300 Å and the target drain rating was 20 V. Where Xepi(flat) is less than 3 μm thick, breakdown occurs in the diode cell 272 and increases with Xepi(flat). When Xepi(flat) is above about 4 μm thick, breakdown occurs in the MOSFET cell 270 and the breakdown voltage thus becomes independent of Xepi(flat).

Curves 286 and 288 in FIG. 28 show the difference between the breakdown voltage of the MOSFET cell 270 and the diode cell 272 at N-epitaxial concentrations of $2.0 \times 10^{16}$ cm$^{-3}$ and $3.0 \times 10^{16}$ cm$^{-3}$, respectively. Assuming that a difference in the breakdown voltage between the MOSFET cell and the diode cell of about 5 V was acceptable, an N-epi concentration of $2.0 \times 10^{16}$ cm$^{-3}$ and an xepi(flat) of 3 μm would yield a satisfactory device. In other situations other devices having parameters within the ranges shown in FIG. 28 would yield satisfactory results.

Figure 29:
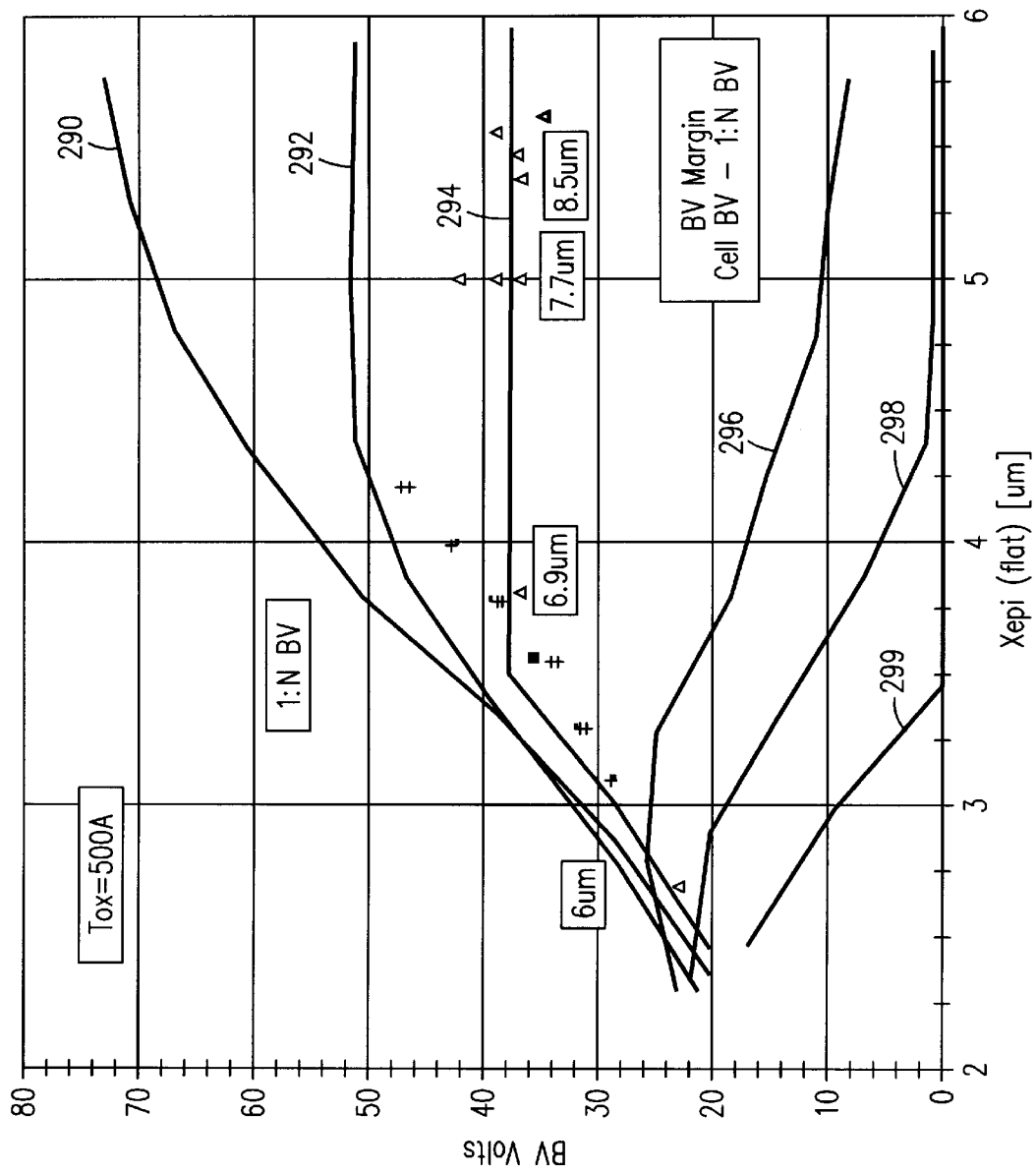
FIG. 29 illustrates a graph showing the breakdown voltage as a function of the epitaxial layer thickness 30-V drain, 20-V gate, N-channel MOSFET using the "reachthrough" approach.

FIG. 29 shows a similar set of curves for a "reachthrough" 30-V drain, 20-V gate N-channel device having a gate oxide thickness of 500 A. Curves 290, 292 and 294 show the breakdown voltage of the device at N-epi concentrations of $5.0 \times 10^{15}$ cm$^{-3}$, $1.0 \times 10^{16}$ cm$^{-3}$ and $2.0 \times 10^{16}$ cm$^{-3}$, respectively. Curves 266, 298 and 299 show the difference between the breakdown voltage of the MOSFET cell 270 and the diode cell 272 at N-epitaxial concentrations of $5.0 \times 10^{15}$ cm$^{-3}$, $1.0 \times 10^{16}$ cm$^{31\ 3}$ and $2.0 \times 10^{16}$ cm$^{-3}$, respectively.

The curves in FIGS. 28 and 29 were developed by simulation. The data points (squares, triangle, diamonds, etc.) represent actual experimental results.

Figure 30:
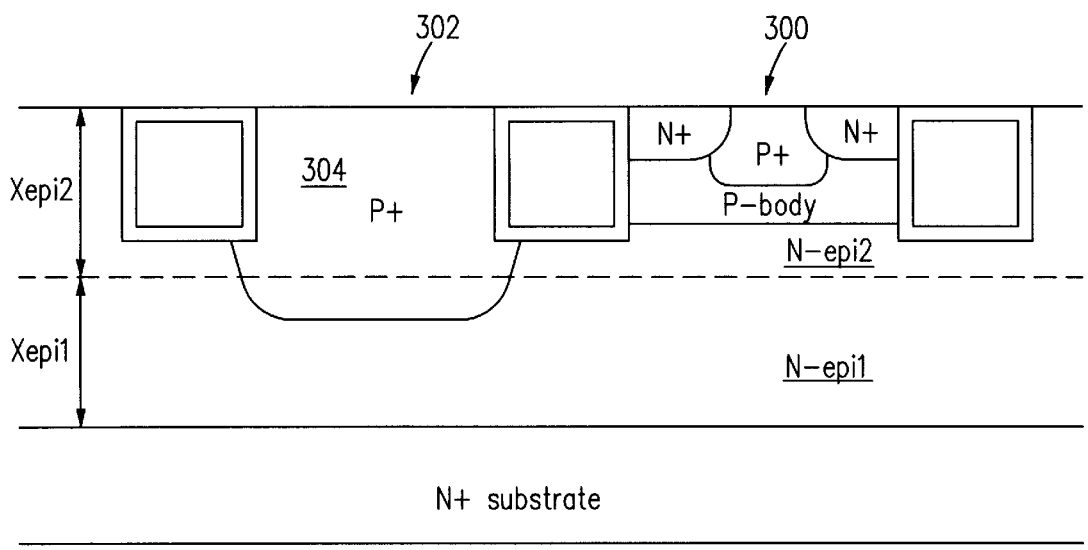
FIG. 30 illustrates a cross-sectional view of a "stepped epi" type of MOSFET structure, including a MOSFET cell and a diode cell.
Figure 31:
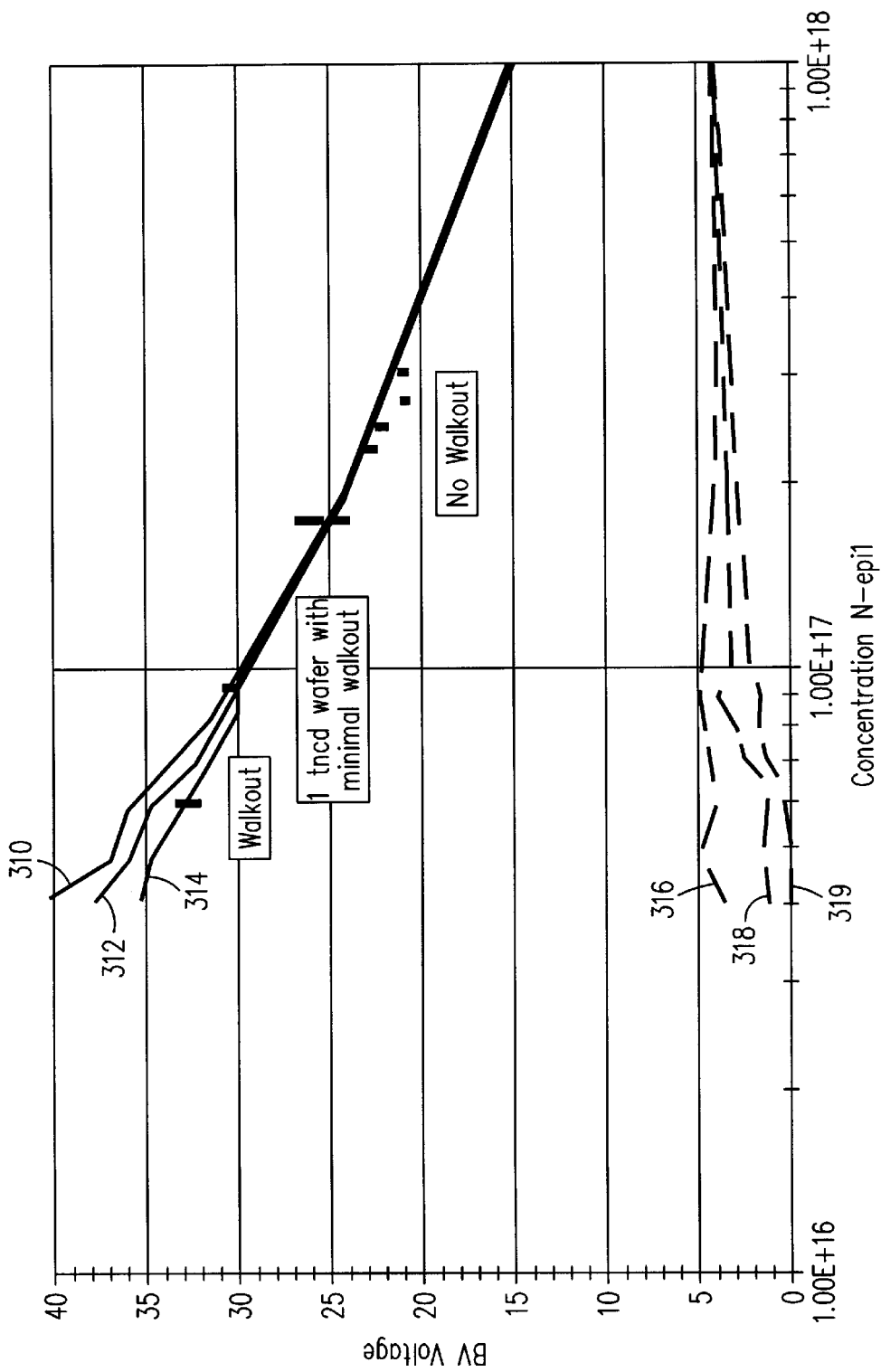
FIG. 31 illustrates a graph showing the breakdown voltage as a function of the dopant concentration of the lower epi sublayer in 20-V drain, 12-V gate N-channel device which uses the "stepped epi" approach.

FIG. 31 shows experimental results obtained from the device shown in FIG. 30, which includes an N-epi layer which is "stepped", i.e., includes sublayers N-epi1 and N-epi2 having different concentrations of N-type dopant, as described in U.S. Pat. No. 5,674,766, issued Oct. 7, 1997. This is a 20-V drain, 12-V gate, "stepped epi" device. The upper sublayer N-epi2 is 3.5 microns thick (Xepi2), although in other embodiments N-epi2 could range from 2 µm to 5 µm thick. The trenches and the P-body regions in MOSFET cell 300 extend only into the upper sublayer N-epi2, while the deep P+ diffusion in diode cell 302 extends through N-epi2 and into the lower sublayer N-epi1. In a P-channel device the conductivities would be reversed. In FIG. 31, the horizontal axis represents the dopant concentration of the lower sublayer N-epi1 which varies from $1.0 \times 10^{16}$ cm$^{-3}$ to $1.0 \times 10^{18}$ cm$^{-3}$. Curves 310, 312 and 314 show the breakdown voltage of the device when the upper sublayer N-epi2 has a dopant concentration of $5.0 \times 10^{15}$ cm$^{-3}$, $1.0 \times 10^{16}$ cm$^{-3}$ and $1.5 \times 10^{16}$ cm$^{-3}$, respectively. The dashed curves 316, 318 and 319 show the difference between the breakdown voltage of the MOSFET cell 300 and the diode cell 302 when sublayer N-epi1 has dopant concentrations of $5.0 \times 10^{15}$ cm$^{-3}$, $1.0 \times 10^{16}$ cm$^{-3}$ and $1.5 \times 10^{16}$ cm$^{-3}$, respectively. In these embodiments the sublayers N-epi1 are made thick enough that the breakdown voltages of the MOSFET cell 300 and diode cell 302 are independent of the thicknesses of the sublayers N-epi1.

Figure 32:
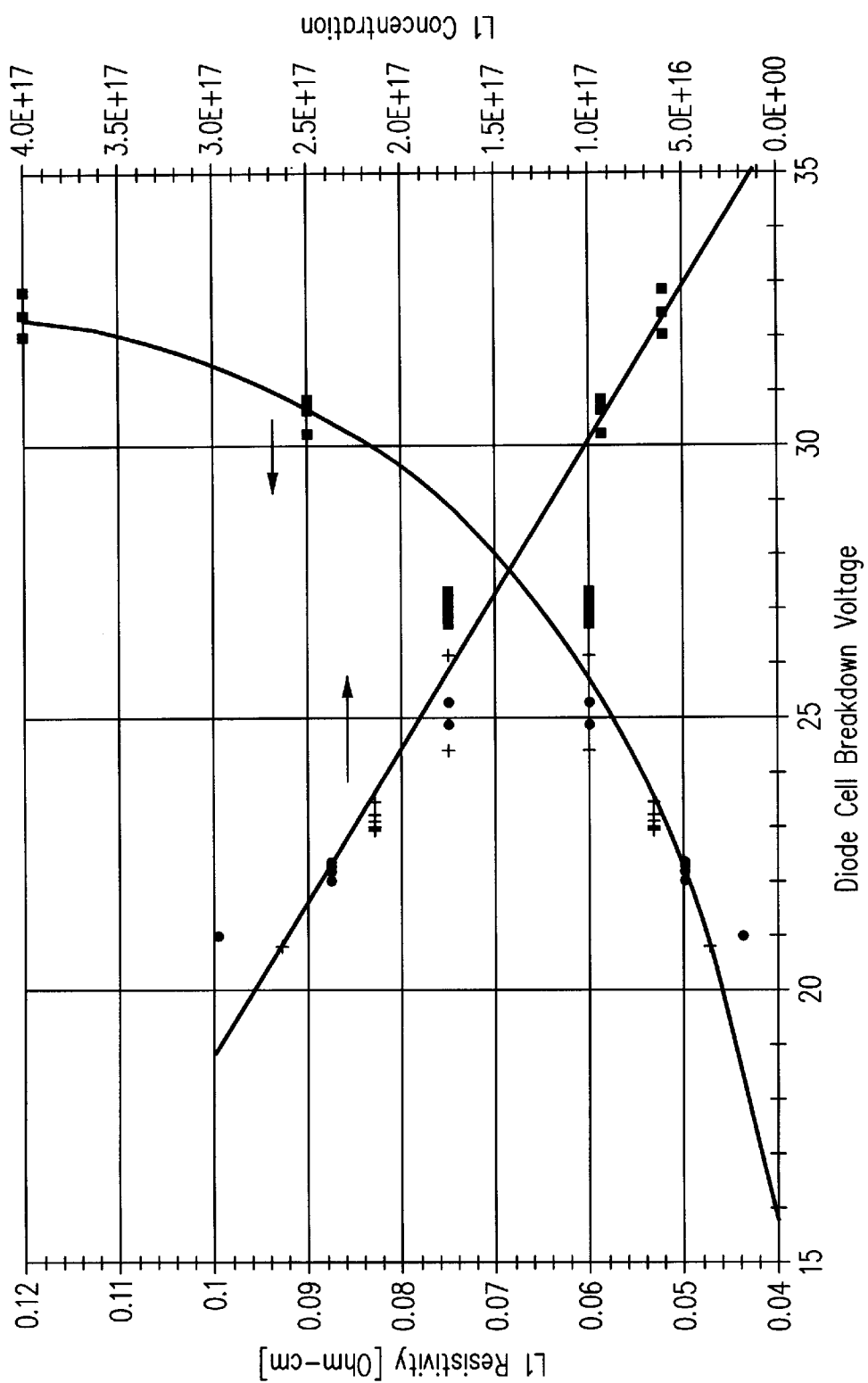
FIG. 32 illustrates a graph of the breakdown voltage in the diode cell (horizontal axis) as a function of the resistivity and dopant concentration of the lower epi sublayer.

FIG. 32 shows a graph of the breakdown voltage in the diode cell (horizontal axis) as a function of the resistivity (lefthand vertical axis) and dopant concentration (righthand vertical axis) of the lower sublayer N-epi1.

Figure 33:
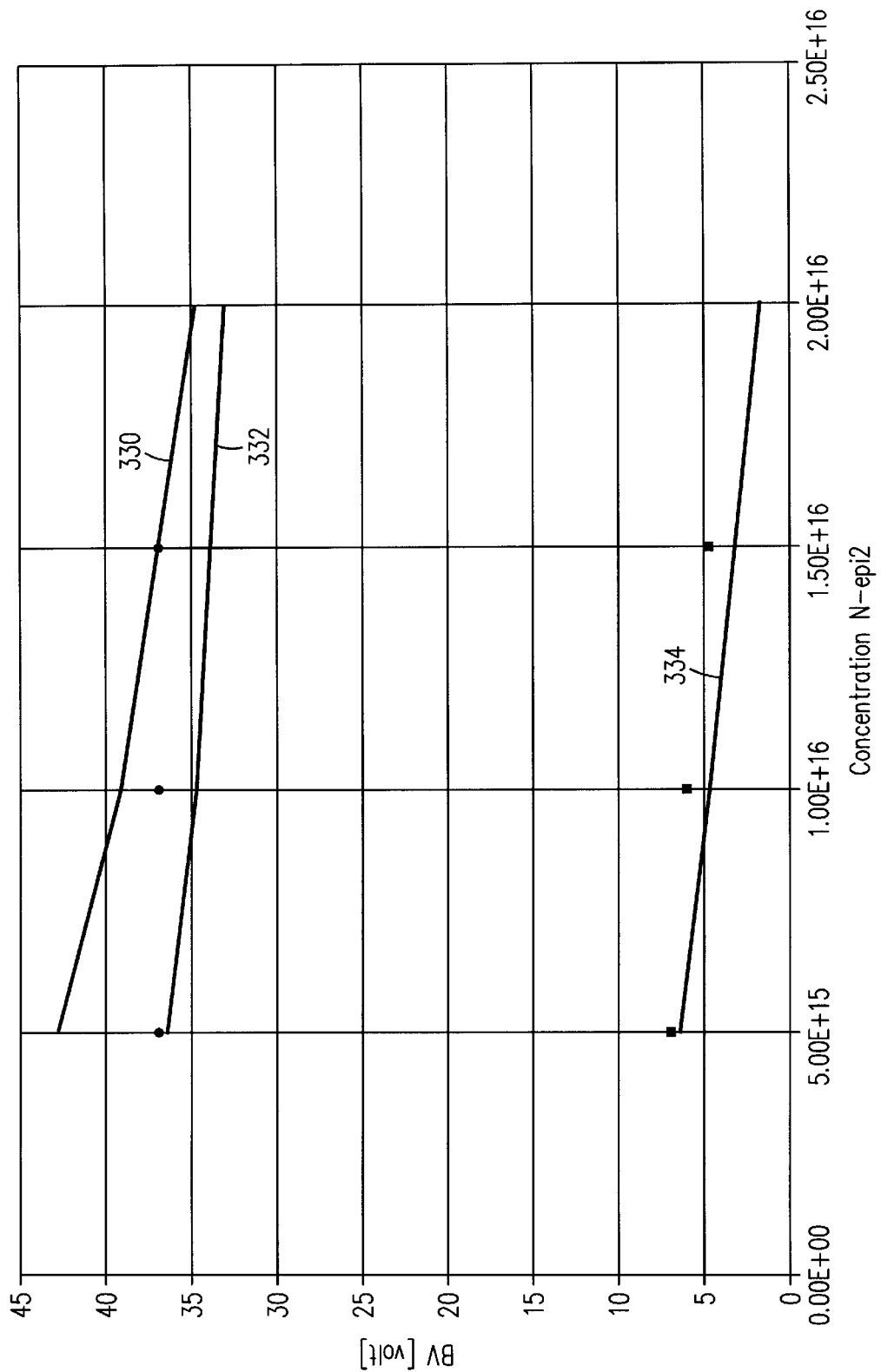
FIGS. 33, 34 and 35 show various data for a 30-V drain, 20-V gate N-channel device which uses the stepped epi approach.
Figure 34:
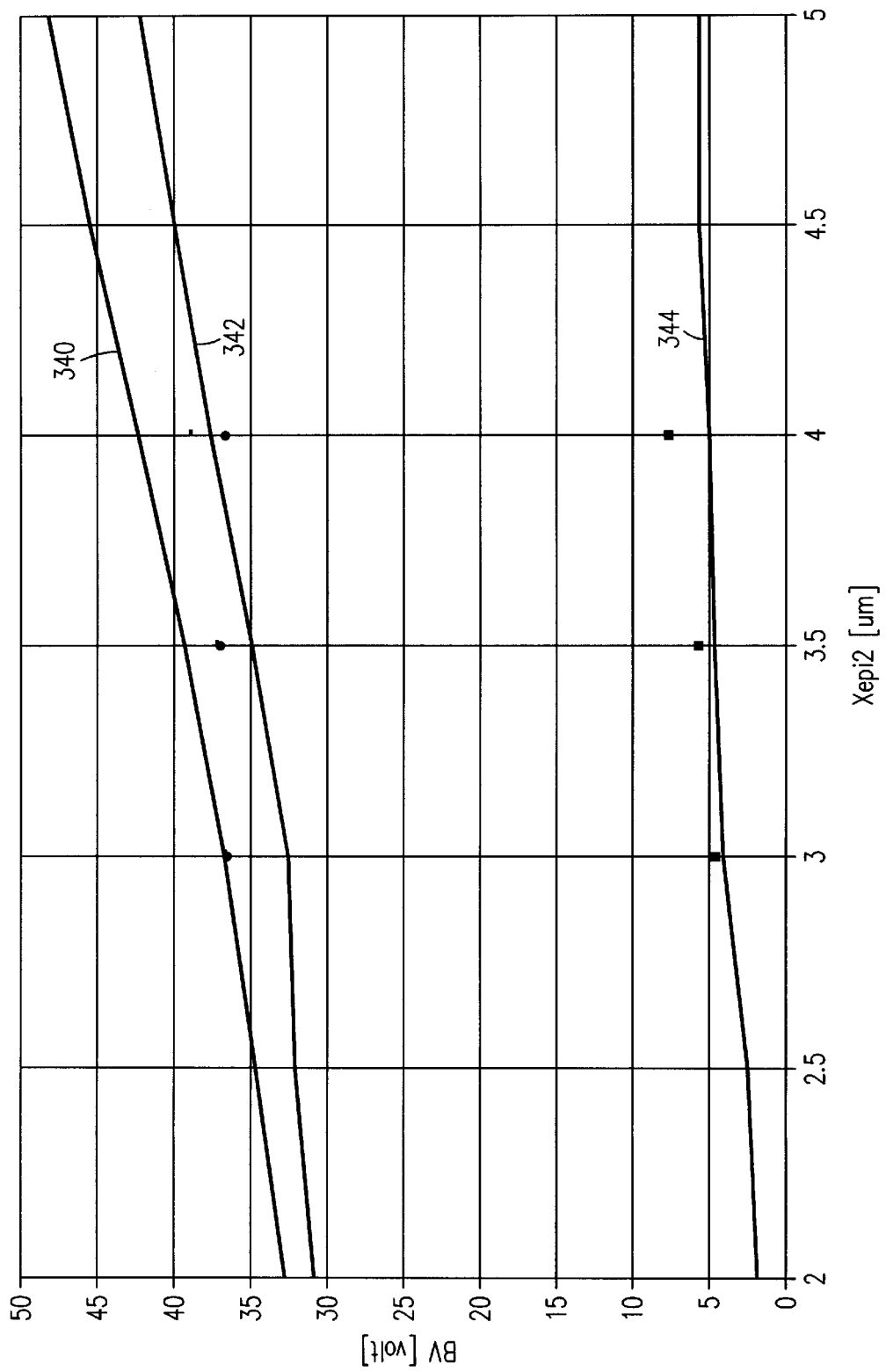
Figure 35:
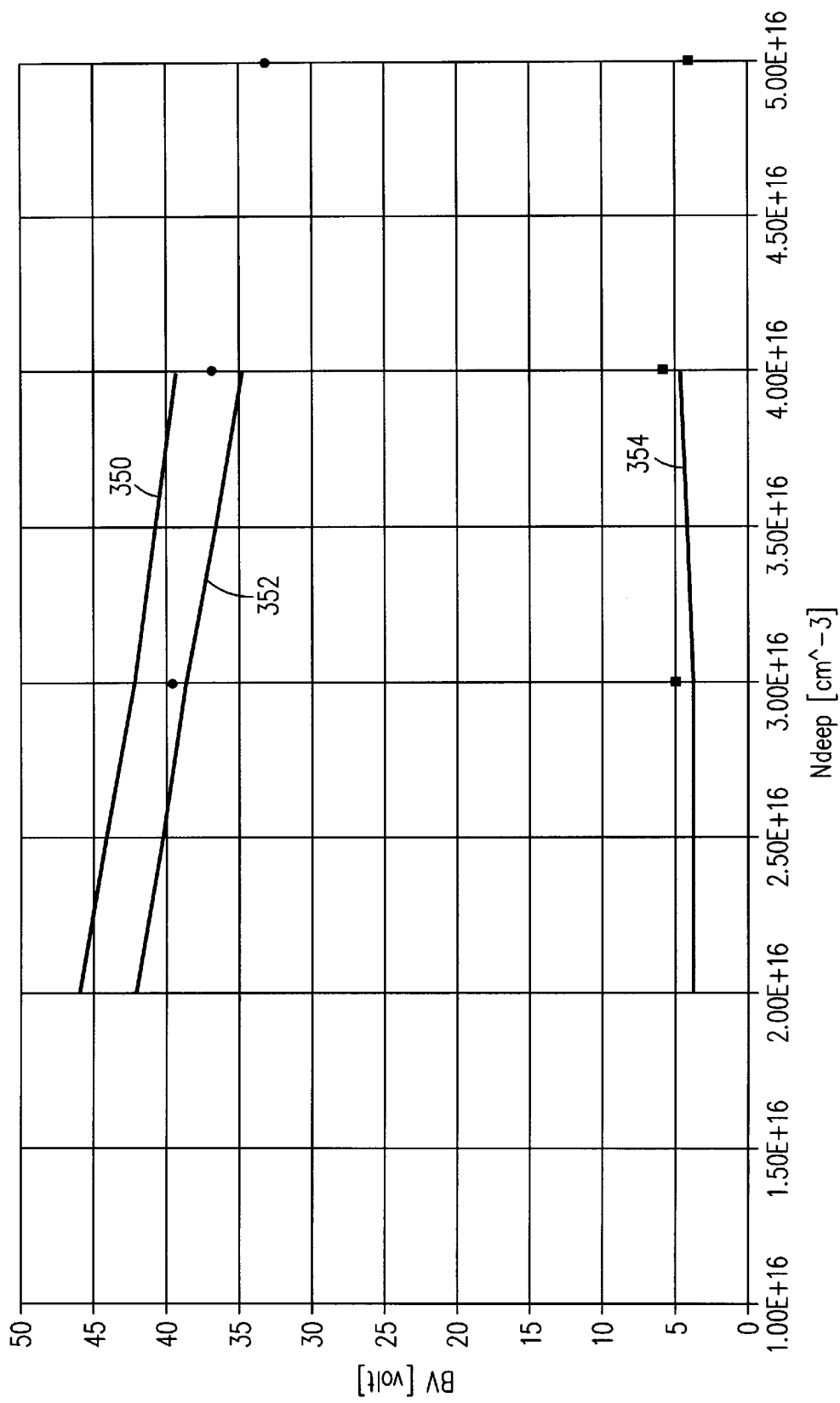

FIGS. 33, 34 and 35 show similar data for a stepped epi N-channel device having a 30-V drain voltage, 20-V gate voltage. In FIG. 33, curve 330 shows the breakdown voltage of a MOSFET cell, curve 332 shows the breakdown voltage of a diode cell and curve 334 shows the difference between the breakdown voltage in the MOSFET and diode cells. The dopant concentration for the lower epi sublayer was $4 \times 10^{16}$ cm$^{-3}$, and the upper sublayer was 3.5 µm thick. The horizontal axis represents the dopant concentration of the upper epi sublayer, which ranged from $5.0 \times 10^{15}$ cm$^{-3}$ to $2.5 \times 10^{16}$ cm$^{-3}$. This range could extend up to $3.0 \times 10^{16}$ cm$^{-3}$, with $2.0 \times 10^{16}$ being a preferred concentration.

FIGS. 34 and 35 show the data for the same device in different form. In FIG. 34, curve 340 shows the breakdown voltage for the MOSFET cell, curve 342 shows the breakdown voltage for the diode cell, and curve 344 shows the difference between the two values. The dopant concentrations for the upper and lower epi sublayers were $1.0 \times 10^{16}$ cm$^{-3}$ and $4 \times 10^{16}$ cm$^{-3}$, respectively. The horizontal axis represents the thickness of the upper sublayer, which ranges from 2 µm to 5 µm, with 3 µm being preferred. In FIG. 35, curve 350 shows the breakdown voltage for the MOSFET cell, curve 352 shows the breakdown voltage for the diode cell, and curve 354 shows the difference between the two values. The dopant concentration and thickness of the upper epi sublayer were $1.0 \times 10^{16}$ cm$^{-3}$ and 3.5 µm, respectively. The horizontal axis represents the dopant concentration of the lower epi sublayer, which ranges from $1 \times 10^{16}$ cm$^{-3}$ to $5.0 \times 10^{16}$ cm$^{-3}$, with $4 \times 10^{16}$ cm$^{-3}$ being preferred.

Figure 36:
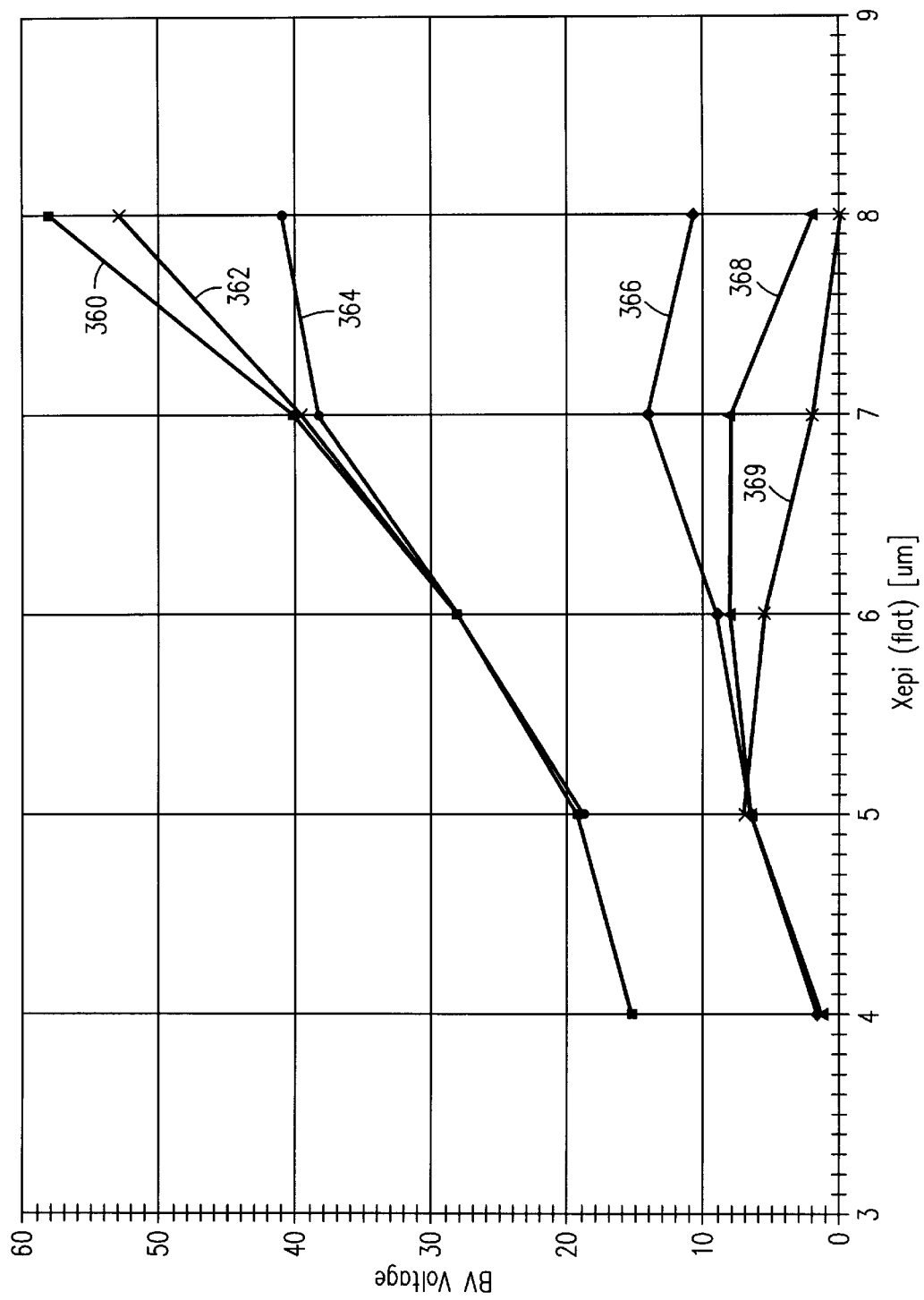
FIG. 36 shows various data for a 30-V drain, 20-V gate P-channel device which uses the reachthrough approach.

FIG. 36 shows similar data for a 30-V drain, 20-V gate P-channel device, which utilized the "reachthrough" approach. Curves 360, 362 and 364 show the breakdown voltages of the diode cells when the thickness of the P-epi layer was varied from 4 µm to 8 µm, and represent P-epi concentrations of $5.0 \times 10^{15}$ cm$^{-3}$, $1.0 \times 10^{16}$ cm$^{-3}$ and $2.0 \times 10^{16}$ cm$^{-3}$, respectively. Curves 366, 368 and 369 show the difference between the breakdown voltages of the MOSFET and diode cells at the same levels of P-epi concentration, respectively.

Figure 37:
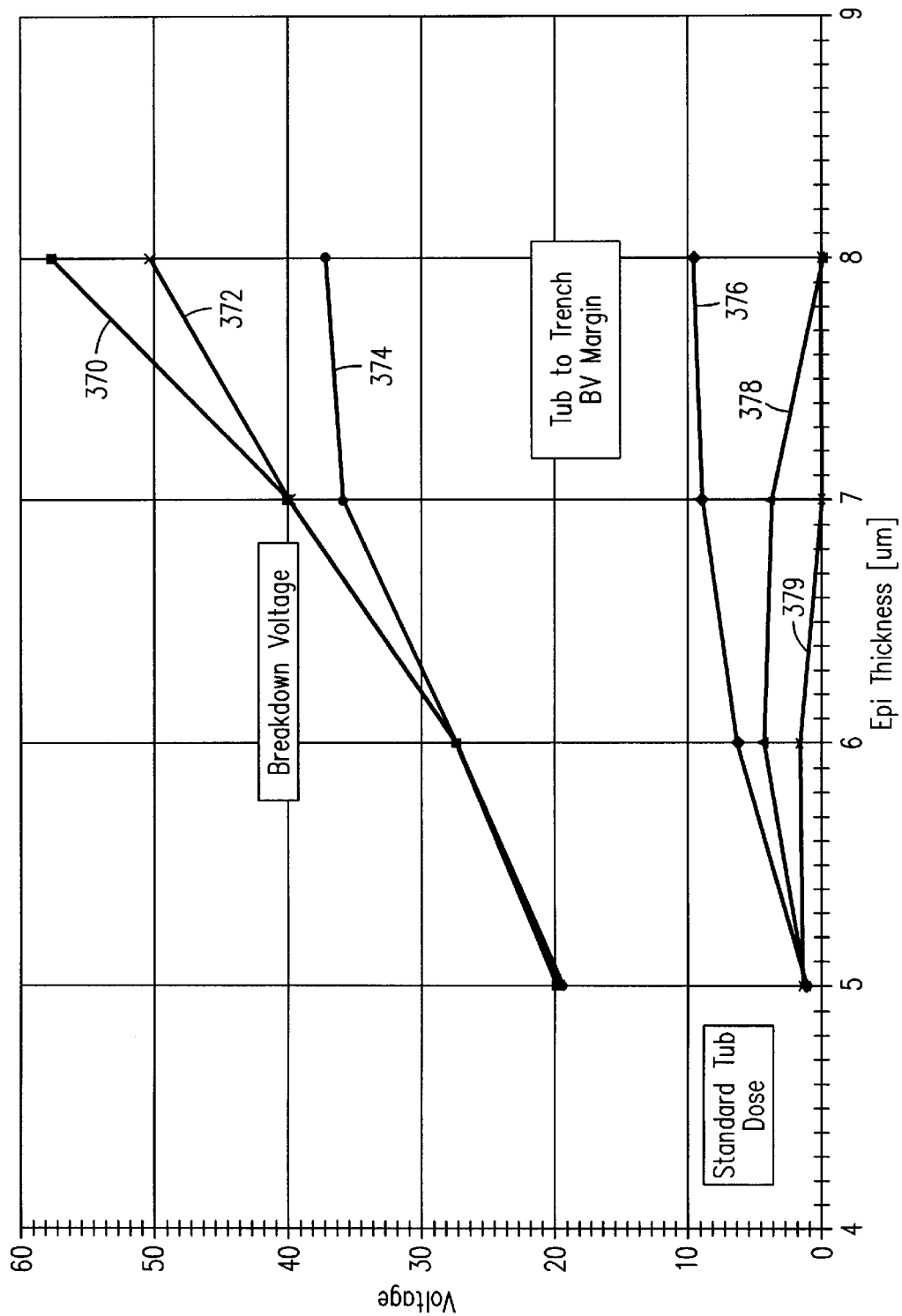
FIGS. 37 and 38 show the breakdown voltage of the diode cell and the difference between the breakdown voltages for the diode and MOSFET cells as a function of epi concentration for different implant doses and drive-in times for the diode diffusion.
Figure 38:
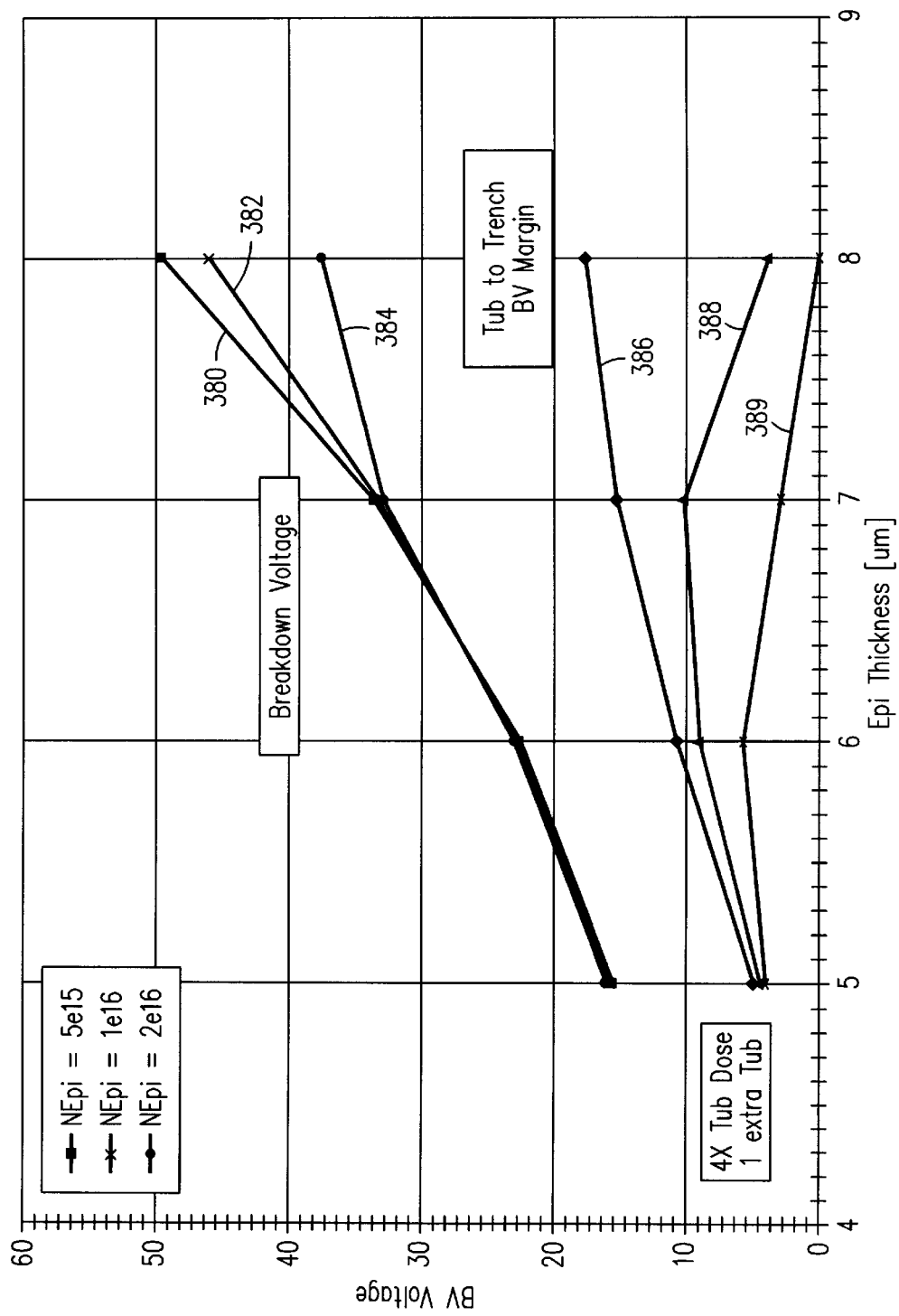

FIGS. 37 and 38 show data for a P-channel 20-V drain, 12-V gate device, which used the "reachthrough" approach. In both figures the breakdown voltage is plotted as a function of the P-epi layer thickness. Curves 370 and 380 show the diode breakdown voltage at a P-epi dopant concentration of $5.0 \times 10^{15}$ cm$^{-3}$; curves 372 and 382 show the diode breakdown voltage at a P-epi dopant concentration of $1.0 \times 10^{16}$ cm$^{-3}$; and curves 374 and 384 show the diode breakdown voltage at a P-epi dopant concentration $2.0 \times 10^{16}$ cm$^{-3}$. Curves 376 and 386 show the difference in the breakdown voltage between the diode and MOSFET cells at a P-epi dopant concentration of $5.0 \times 10^{15}$ cm$^{-3}$; curves 378 and 388 show the difference in the breakdown voltage between the diode and MOSFET cells at a P-epi dopant concentration of $1.0 \times 10^{16}$ cm$^{-3}$; and curves 379 and 389 show the difference in the breakdown voltage between the diode and MOSFET cells at a P-epi dopant concentration of $2.0 \times 10^{16}$ cm$^{-3}$.

In the P-channel 20-V drain device it is somewhat more difficult to get the diode cells to break down before the MOSFET cells. With the thinner gate oxide, as discussed above FPI breakdown tends to occur before PN junction breakdown. Thus it may be necessary to either increase the dose of the implant used to form the diffusion in the diode cells, or to use extra drive-in steps to increase the depth of the diode diffusion. FIG. 37 shows the results of a "standard" implant dose of $1.0 \times 10^{15}$ cm$^{-2}$, but with two drive-ins at 1050–1100° C. for 1–3 hrs. FIG. 38 shows the results of an implant dose of $4.0 \times 10^{15}$ cm$^{-2}$, with two drive-ins at 1050–1100° C. for 1–3 hrs.

Figure 39:
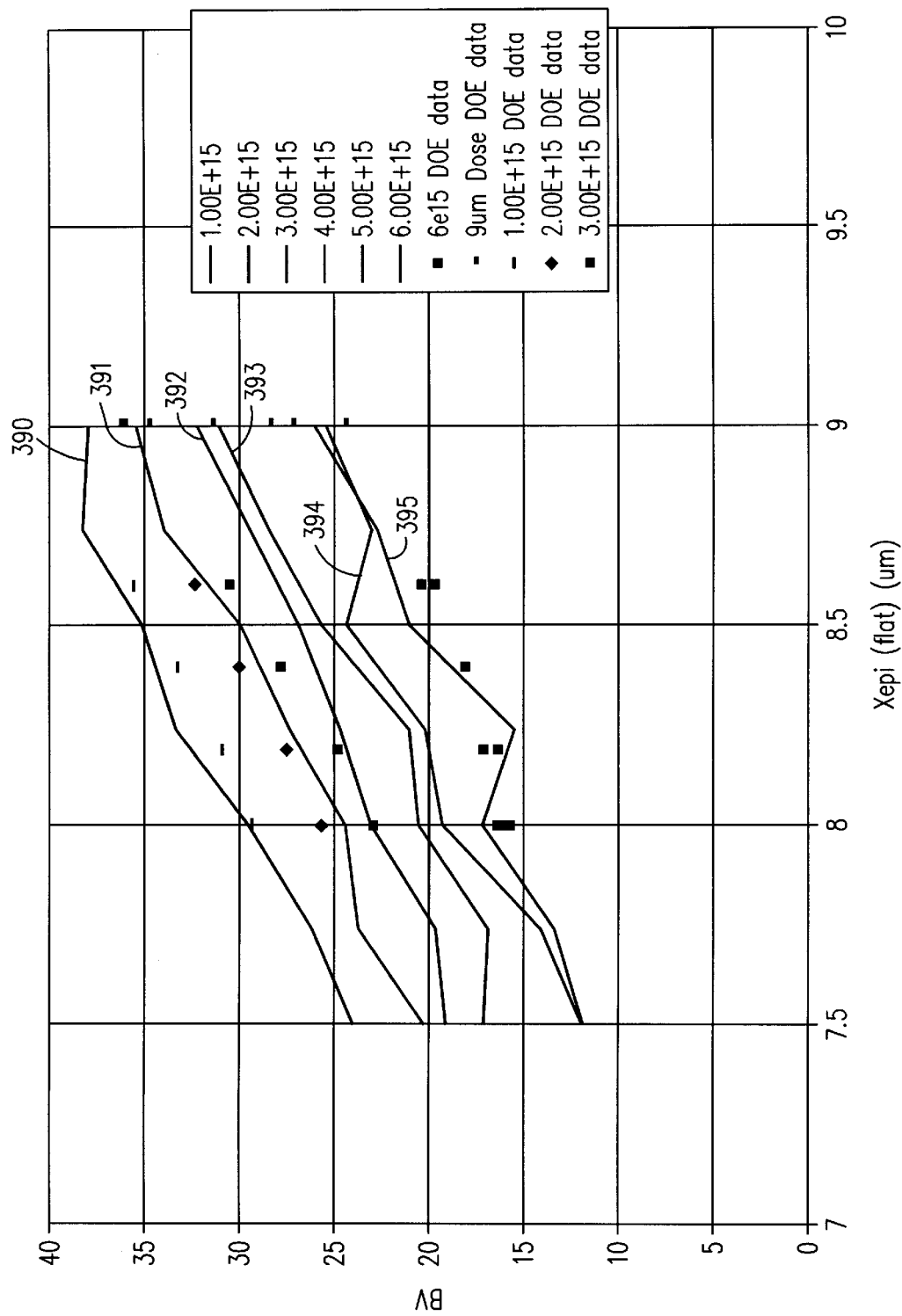
FIG. 39 shows the breakdown voltage for an N-type diode diffusion as a function of the thickness of the P-epi layer for six different implant doses.

FIG. 39 shows the breakdown voltage for an N-type diode diffusion approximately 3 µm deep as a function of the thickness of the P-epi layer for six different implant doses: $1.0 \times 10^{15}$ cm$^{-2}$ (curve 390); $2.0 \times 10^{15}$ cm$^{-2}$ (curve 391); $3.0 \times 10^{15}$ cm$^{-2}$ (curve 392); $4.0 \times 10^{15}$ cm$^{-2}$ (curve 393); $5.0 \times 10^{15}$ cm$^{-2}$ (curve 394); and $6.0 \times 10^{15}$ cm$^{-2}$ (curve 395).

Figure 40:
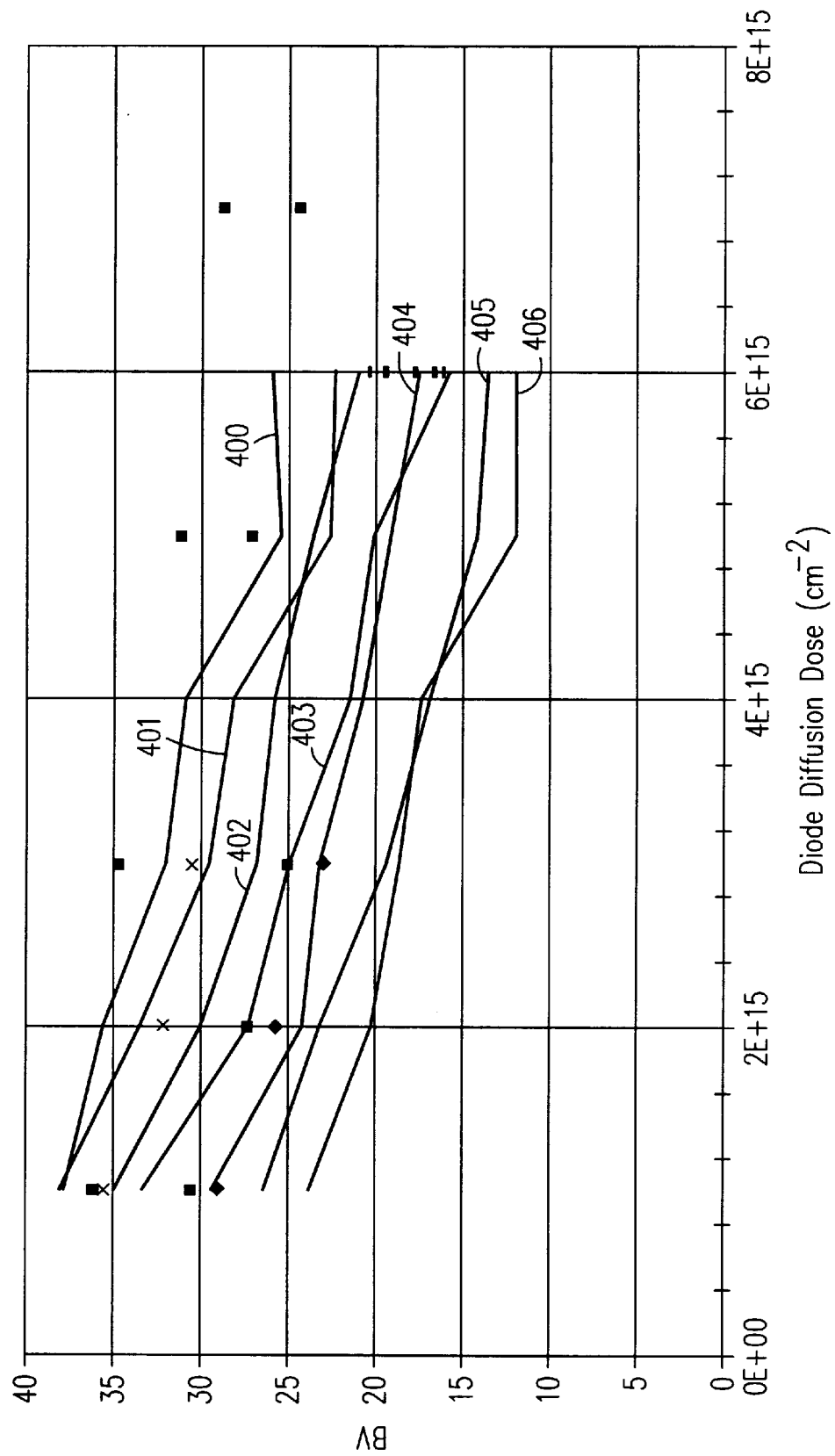
FIG. 40 shows the breakdown voltage for an N-type diode diffusion as a function of the implant dose for seven different thicknesses of the P-epi layer.

FIG. 40 shows the breakdown voltage for an N-type diode diffusion approximately 3 µm deep as a function of the implant dose for seven different thicknesses of the P-epi layer: 9.0 µm (curve 400); 8.75 µm (curve 401); 8.5 µm (curve 402); 8.25 µm (curve 403); 8.0 µm (curve 404); 7.75 µm (curve 405); and 7.5 µm (curve 406).

The embodiments described above are illustrative only and not limiting. Numerous alternative embodiments in accordance with the broad principles of this invention will be apparent to those skilled in the art.

We claim:

1. A trench-gated power MOSFET comprising:
   a semiconductor material;
   a gate positioned in a trench formed in a surface of said semiconductor material, said trench comprising a lattice, said lattice defining
      a plurality of cells, each of said cells comprising either a MOSFET cell or a diode cell, said plurality of cells including at least one MOSFET cell and one diode cell, each of said MOSFET cells comprising a source region of a first conductivity type and a body region of a second conductivity type, said body region adjoining said source region and comprising a channel region, said channel region being for conducting a current between said source and drain regions when said power MOSFET is turned on, said source region and said body region abutting a side of said trench;
   each of said diode cells comprising a protective diffusion of said second conductivity type, said protective diffusion adjoining a region of said first conductivity type so as to form a diode, there being a predetermined number of said MOSFET cells for each diode cell, said diode being connected in parallel with said channel region in each of said MOSFET cells, said diode cells containing no channel region adjacent a side of said trench, and said diode cells being distributed at repetitive intervals in said lattice so as to limit the strength of an electric field and the formation of hot carriers in the vicinity of said trench.

2. The MOSFET of claim 1 wherein said semiconductor material comprises a substrate and an epitaxial layer formed on a surface of said substrate.

3. The MOSFET of claim 2 wherein a bottom of said trench is located in said epitaxial layer and is separated from an interface between said substrate and said epitaxial layer.

4. The MOSFET of claim 3 wherein a bottom of said protective diffusion is located in said epitaxial layer and is separated from an interface between said substrate and said epitaxial layer.

5. The MOSFET of claim 4 wherein said protective diffusion is shorted to the source region of each of said MOSFET cells.

6. The MOSFET of claim 2 wherein a bottom of said trench is located in said substrate.

7. The MOSFET of claim 6 wherein a bottom of said protective diffusion is located at an interface between said substrate and said epitaxial layer.

8. The MOSFET of claim 6 wherein a region of said first conductivity in said epitaxial layer separates said body region from said substrate in said MOSFET cells.

9. The MOSFET of claim 1 wherein said trench forms a lattice of square cells.

10. The MOSFET of claim 1 wherein said trench forms a lattice of cells in the form of stripes.

11. The MOSFET of claim 6 wherein said gate is separated from said semiconductor material by a gate oxide layer, and wherein said diode has a breakdown voltage that is lower than a voltage that causes damage to said gate oxide layer.

12. The MOSFET of claim 8 wherein a region of said first conductivity in said epitaxial layer separates said protective diffusion from said substrate in said diode cell.

13. A trench-gated power MOSFET comprising:

a semiconductor material comprising a substrate and an epitaxial layer formed on a surface of said substrate, said substrate having a greater doping concentration than said epitaxial layer;

a gate positioned in a trench and separated from said semiconductor material by an oxide layer, said trench being formed in a surface of said epitaxial layer and extending into said substrate, said trench defining a plurality of MOSFET cells, each of said MOSFET cells comprising a source region of a first conductivity type and a body region of a second conductivity type adjoining said source region, said source region and said body region abutting a side of said trench;

wherein said body region adjoins a drain region of said first conductivity type, a PN junction between said body region and said drain region forming a diode, and wherein said diode has a breakdown voltage that is lower than a voltage that causes damage to said oxide layer.

14. The MOSFET of claim 13 wherein said body region is shorted to said source region in each of said MOSFET cells.

* * * * *